United States Patent
Ohsawa et al.

(10) Patent No.: US 6,838,224 B2
(45) Date of Patent: Jan. 4, 2005

(54) CHEMICAL AMPLIFICATION, POSITIVE RESIST COMPOSITIONS

(75) Inventors: Youichi Ohsawa, Nakakubiki-gun (JP); Jun Watanabe, Nakakubiki-gun (JP); Takanobu Takeda, Nakakubiki-gun (JP); Akihiro Seki, Nakakubiki-gun (JP)

(73) Assignee: Shi-Etsu Chemical Co., Ltd., Tokyo (JP)

( * ) Notice: Subject to any disclaimer, the term of this patent is extended or adjusted under 35 U.S.C. 154(b) by 166 days.

(21) Appl. No.: 09/799,009

(22) Filed: Mar. 6, 2001

(65) Prior Publication Data

US 2001/0033994 A1 Oct. 25, 2001

(30) Foreign Application Priority Data

Mar. 7, 2000 (JP) ........................................ 2000-061357

(51) Int. Cl.$^7$ ............................. G03C 1/73; G03F 7/039
(52) U.S. Cl. ................... 430/270.1; 430/326; 430/311; 430/319; 430/905; 430/910; 430/914; 430/921; 430/925; 430/919; 430/920
(58) Field of Search ............................. 430/270.1, 905, 430/910, 914, 326, 921, 925, 919, 920, 311, 319

(56) References Cited

U.S. PATENT DOCUMENTS

| | | | |
|---|---|---|---|
| 4,491,628 A | 1/1985 | Ito et al. | 430/270.1 |
| 5,468,589 A | 11/1995 | Urano et al. | 430/270.1 |
| 5,558,971 A | 9/1996 | Urano et al. | 430/270.1 |
| 5,558,976 A | 9/1996 | Urano et al. | 430/270.1 |
| 5,670,299 A | 9/1997 | Urano et al. | 430/270.1 |
| 6,022,665 A * | 2/2000 | Watanabe et al. | 430/270.1 |
| 6,033,826 A * | 3/2000 | Urano et al. | 430/270.1 |
| 6,344,529 B1 * | 2/2002 | Carnahan et al. | 526/134 |

FOREIGN PATENT DOCUMENTS

| | | |
|---|---|---|
| JP | 63-27829 | 2/1988 |
| JP | 2-27660 | 6/1990 |
| JP | 5-249682 | 9/1993 |
| JP | 6-308437 | 11/1994 |
| JP | 8-123032 | 5/1996 |
| JP | 2000-235264 * | 8/2000 |

OTHER PUBLICATIONS

Machine–assisted English translation for JP 2000–235264 (provided by Japan Patent Office), Aug. 29, 2000.*
English abstract of JP–A 63–27829.
English abstract of JP–A 6–308437.

* cited by examiner

*Primary Examiner*—Mark F. Huff
*Assistant Examiner*—Sin J. Lee
(74) *Attorney, Agent, or Firm*—Millen, White, Zelano & Branigan, P.C.

(57) ABSTRACT

A chemical amplification, positive resist composition is provided comprising (A) a photoacid generator and (B) a resin which changes its solubility in an alkali developer under the action of acid and has substituents of the formula: $C_6H_{11}$—$(CH_2)_n$OCH$(CH_2CH_3)$— wherein $C_6H_{11}$ is cyclohexyl and n=0 or 1. The composition has many advantages including improved focal latitude, improved resolution, minimized line width variation or shape degradation even on long-term PED, minimized defect left after coating, development and stripping, and improved pattern profile after development and is suited for microfabrication by any lithography, especially deep UV lithography.

19 Claims, No Drawings

CHEMICAL AMPLIFICATION, POSITIVE RESIST COMPOSITIONS

This invention relates to chemical amplification, positive resist compositions which are sensitive to such radiation as UV, deep UV, electron beams, x-rays, excimer laser beams, γ-rays, and synchrotron radiation and suitable for the microfabrication of integrated circuits.

BACKGROUND OF THE INVENTION

While a number of efforts are currently being made to achieve a finer pattern rule in the drive for higher integration and operating speeds in LSI devices, deep-ultraviolet lithography is thought to hold particular promise as the next generation in microfabrication technology. Deep UV lithography enables micropatterning to a feature size of 0.3 or 0.4 μm. One technology that has attracted a good deal of attention recently utilizes as the deep UV light source a high-intensity KrF excimer laser, especially an ArF excimer laser featuring a shorter wavelength. There is a desire to have a resist material capable of micropatterning to a smaller feature size.

In this regard, the recently developed, acid-catalyzed, chemical amplification type positive resist materials (see JP-B 2-27660 and JP-A 63-27829) are expected to comply with the deep UV lithography because of their many advantages including high sensitivity, resolution and dry etching resistance.

On use of the chemical amplification type resist compositions, especially chemical amplification type, positive working resist compositions, a resist film is formed by dissolving a resin having acid labile groups as a binder and a compound capable of generating an acid upon exposure to radiation (to be referred to as photoacid generator) in a solvent, applying the resist solution onto a substrate (inclusive of a stepped substrate) by a variety of methods, and evaporating off the solvent optionally by heating. The resist film is then exposed to radiation, for example, deep UV through a mask of a predetermined pattern. This is optionally followed by post-exposure baking (PEB) for promoting acid-catalyzed reaction. The exposed resist film is developed with an aqueous alkaline developer for removing the exposed area of the resist film, obtaining a positive pattern profile. The pattern profile of resist is then transferred to the substrate by dry or wet etching. Since the stepped substrate and the aligner used in device fabrication have more or less errors, there is a desire to have a resist material capable of forming an accurate pattern even when the focal point is somewhat offset, i.e., having a wide depth of focus.

Several acid labile group-substituted resins are known suitable for use in chemically amplified positive resist compositions. Included are resins protected with t-butyl ester groups or t-butoxycarbonyl groups (JP-B 2-27660 referred to above), resins protected with 1-ethoxyethyl groups (JP-A 5-249682 and JP-A 6-308437), and resins protected with t-butoxycarbonyl groups and 1-alkoxyethyl groups (JP-A 8-123032). These chemically amplified resist compositions, however, have their own problems. A variety of difficulties arise on the practical application of these compositions. Such problems include, for example, environmental stability, focal latitude, particle, and storage stability.

The environmental stability is generally divided into two categories. One environmental stability is related to the deactivation of a photo-generated acid by an air-borne base above the resist film or a base beneath the resist film and on the substrate. This phenomenon is often seen when a photoacid generator capable of generating an acid having a high acid strength is used. It is expected that this problem is solved by introducing into the resin acid labile groups which are more easy to cleavage by acid or by lowering or weakening the acid strength of the photo-generated acid. The other environmental stability is that when the period from exposure to post-exposure baking (PEB) is prolonged, which is known as post-exposure delay (PED), the photo-generated acid diffuses in the resist film so that acid deactivation may occur when the acid labile groups are less susceptible to scission and acid decomposition may take place when the acid labile groups are susceptible to scission, often inviting a change of the pattern profile in either case. For example, this often invites a narrowing or slimming of the line width in the unexposed area in the case of chemical amplification type, positive working, resist compositions having acid labile groups mainly of acetal type.

Of the above-referred protective groups, the t-butoxycarbonyl groups have poor environmental stability on the surface of resist film or on the substrate (i.e., at the interface between the resist and the substrate). As a result, the pattern obtained can have an outward extending top (T-top profile) or is not sharply defined at all. Alternatively, pattern footing and tapering are sometimes possible. Also the resolving power is too low to provide a finer pattern.

The use of 1-alkoxyethyl groups, which have a high resolving power, also has problems. As a result of PED, the pattern profile varies to narrow the line width in the unexposed area (slimming). When the focal point is offset on a stepped substrate, the pattern on the mask cannot be accurately transferred to the resist film. Specifically, although a rectangular pattern is obtained on accurate focusing, any offsetting of the focal point results in the pattern top being noticeably reduced, failing to keep rectangularity. Then the depth of focus is of significance when it is desired to produce a finer pattern. If the depth of focus is narrow, it becomes impossible to form an accurate pattern on a stepped substrate is difficult, and hence to fabricate microelectronic devices by relying on pattern transfer through etching.

Even when a resin having acid labile groups of at least two types such as t-butoxycarbonyl and 1-alkoxyalkyl groups is used in a resist composition, no satisfactory results are obtained with respect to the above-described problems, especially resolution and focal latitude.

SUMMARY OF THE INVENTION

An object of the invention is to provide a chemical amplification, positive resist composition having an improved resolution, pattern profile and focal latitude and having eliminated the problems of adhesion, peeling and defect.

We have found that when a resin which changes its solubility in an alkali developer under the action of acid and has substituents of the following general formula (1) is used in combination with a photoacid generator, there is formulated a chemical amplification, positive resist composition which has an adequate resolution, pattern profile and focal latitude to enable micropatterning. The resulting resist pattern has eliminated the problems of adhesion, stripping, particle and the like. The resist composition is fully effective when processed by deep-UV lithography.

  (1)

Herein $C_6H_{11}$ is cyclohexyl and n is 0 or 1.

Particularly when the resin which changes its solubility in an alkali developer under the action of acid is a polyhydroxystyrene derivative or hydroxystyrene-(meth)acrylic acid copolymer in which some of the hydrogen atoms on phenolic hydroxyl groups and/or carboxyl groups are protected with substituents of formula (1), the above advantages are further enhanced. Better results are obtained upon processing by deep-UV lithography.

According to the invention, there is provided a chemical amplification, positive resist composition comprising (A) a photoacid generator and (B) a resin which changes its solubility in an alkali developer under the action of acid and has substituents of the following general formula (1):

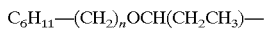
(1)

wherein $C_6H_{11}$ is cyclohexyl and n is 0 or 1.

In one preferred embodiment, the resin (B) is an alkali-soluble resin comprising units of the following formula (2) or (2') wherein some or all of the hydrogen atoms on phenolic hydroxyl groups and/or carboxyl groups are protected with substituents of the formula (1).

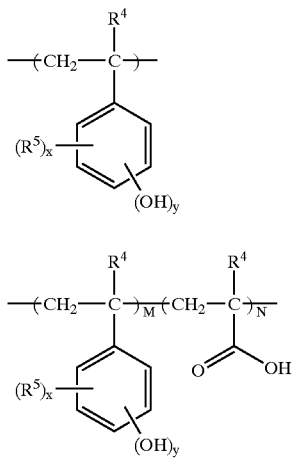

Herein $R^4$ is hydrogen or methyl, $R^5$ is a straight, branched or cyclic alkyl group of 1 to 8 carbon atoms, x is 0 or a positive integer, y is a positive integer, satisfying $x+y \leq 5$, M and N are positive integers satisfying $0 < N/(M+N) \leq 0.5$.

In another preferred embodiment, the resin (B) is a branched, alkali-soluble resin comprising units of the following formula (2") wherein some of the hydrogen atoms on phenolic hydroxyl groups are protected with substituents of the formula (1).

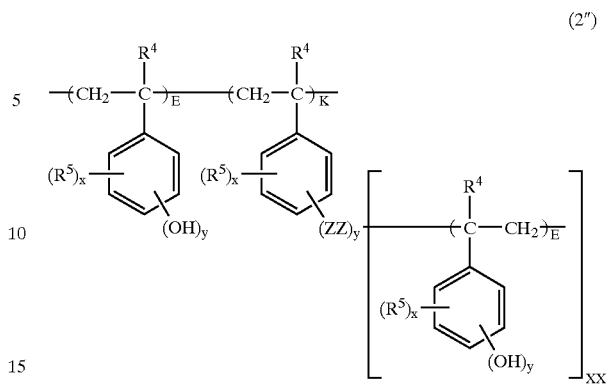

Herein $R^4$, $R^5$, x and y are as defined above, ZZ is a divalent organic group selected from the group consisting of $CH_2$, $CH(OH)$, $CR^5(OH)$, $C=O$, and $C(OR^5)(OH)$, or a trivalent organic group represented by $—C(OH)=$, E may be the same or different and is a positive integer, K is a positive integer, satisfying $0.001 \leq K/(K+E) \leq 0.1$, and XX is 1 or 2.

The resin (B) may further has acid labile groups. Specifically, the resin (B) further has acid labile groups which are selected from among groups of the following general formulae (4) to (7), tertiary alkyl groups of 4 to 20 carbon atoms, trialkylsilyl groups in which each alkyl moiety has 1 to 6 carbon atoms, and oxoalkyl groups of 4 to 20 carbon atoms.

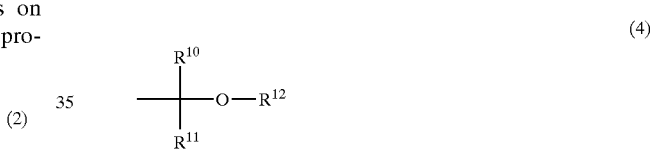

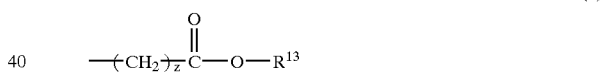

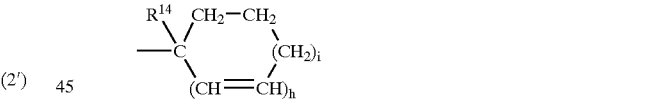

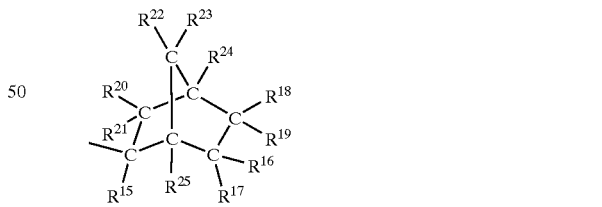

Herein $R^{10}$ and $R^{11}$ each are hydrogen or a straight, branched or cyclic alkyl group of 1 to 18 carbon atoms, $R^{12}$ is a monovalent hydrocarbon group of 1 to 18 carbon atoms which may contain a hetero atom such as oxygen atom, a pair of $R^{10}$ and $R^{11}$, $R^{10}$ and $R^{12}$, or $R^{11}$ and $R^{12}$ may form a ring, each of $R^{10}$, $R^{11}$ and $R^{12}$ is a straight or branched alkylene group of 1 to 18 carbon atoms when they form a ring.

$R^{13}$ is a tertiary alkyl group of 4 to 20 carbon atoms, a trialkylsilyl group in which each alkyl moiety has 1 to 6 carbon atoms, an oxoalkyl group of 4 to 20 carbon atoms, or a group of formula (4), z is an integer of 0 to 6.

$R^{14}$ is a straight, branched or cyclic alkyl group of 1 to 8 carbon atoms or a substituted or unsubstituted aryl group of 6 to 20 carbon atoms, h is equal to 0 or 1, and i is equal to 0, 1, 2 or 3, satisfying 2h+i=2 or 3.

$R^{15}$ is a straight, branched or cyclic alkyl group of 1 to 8 carbon atoms or a substituted or unsubstituted aryl group of 6 to 20 carbon atoms, $R^{16}$ to $R^{25}$ are independently hydrogen or monovalent hydrocarbon groups of 1 to 15 carbon atoms which may contain a hetero atom, $R^{16}$ to $R^{25}$, taken together, may form a ring, and each of $R^{16}$ to $R^{25}$ represents a divalent hydrocarbon group of 1 to 15 carbon atoms which may contain a hetero atom, when they form a ring, or two of $R^{16}$ to $R^{25}$ which are attached to adjoining carbon atoms may bond together directly to form a double bond.

DESCRIPTION OF THE PREFERRED EMBODIMENT

Resin

The chemical amplification, positive resist composition of the invention is defined as comprising (A) a photoacid generator and (B) a resin which changes its solubility in an alkali developer under the action of acid and has substituents of the following general formula (1):

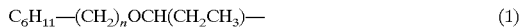

$$C_6H_{11}-(CH_2)_nOCH(CH_2CH_3)- \quad (1)$$

wherein $C_6H_{11}$ is cyclohexyl and n is 0 or 1.

The resin which changes its solubility in an alkali developer under the action of acid and has substituents of formula (1) is described in detail.

The type of the resin is not critical as long as it is an alkali-soluble resin having phenolic hydroxyl groups and/or carboxyl groups in which some or all of the hydrogen atoms on phenolic hydroxyl groups and/or hydroxyl groups of carboxyl groups are substituted with substituents of formula (1).

The alkali-soluble resin having phenolic hydroxyl groups and/or carboxyl groups embraces homopolymers and copolymers of p-hydroxystyrene, m-hydroxystyrene, α-methyl-p-hydroxystyrene, 4-hydroxy-2-methylstyrene, 4-hydroxy-3-methylstyrene, methacrylic acid and acrylic acid, copolymers having carboxylic acid derivatives, diphenyl ethylene and analogues introduced at the terminus of the foregoing polymers, and branched copolymers based on a combination of a hydroxystyrene derivative monomer (as mentioned just above) with a branching monomer such as chloromethylstyrene.

Also included are copolymers obtained by introducing units free of an alkali-soluble site (e.g., styrene, α-methylstyrene, acrylates, methacrylates, hydrogenated hydroxystyrene, maleic anhydride, and maleimide) in addition to the above-mentioned units in such a proportion that the solubility of the copolymer in an alkali developer is not extremely lowered. The acrylates and methacrylates used herein have any substituents which do not undergo acidolysis. Illustrative substituents are straight, branched or cyclic alkyl groups of 1 to 8 carbon atoms and aromatic groups such as aryl groups, though not limited thereto.

Illustrative examples of the alkali-soluble resin, though not limited thereto, include poly(p-hydroxystyrene), poly(m-hydroxystyrene), poly(4-hydroxy-2-methylstyrene), poly(4-hydroxy-3-methylstyrene), poly(α-methyl-p-hydroxystyrene), partially hydrogenated poly(p-hydroxystyrene) copolymers, p-hydroxystyrene/α-methyl-p-hydroxystyrene copolymers, p-hydroxystyrene/α-methylstyrene copolymers, p-hydroxystyrene/styrene copolymers, p-hydroxystyrene/m-hydroxystyrene copolymers, p-hydroxystyrene/styrene copolymers, p-hydroxystyrene/acrylic acid copolymers, p-hydroxystyrene/methacrylic acid copolymers, p-hydroxystyrene/methyl acrylate copolymers, p-hydroxystyrene/acrylic acid/methyl methacrylate copolymers, p-hydroxystyrene/methyl methacrylate copolymers, p-hydroxystyrene/methacrylic acid/methyl methacrylate copolymers, polymethacrylic acid, polyacrylic acid, acrylic acid/methyl acrylate copolymers, methacrylic acid/methyl methacrylate copolymers, acrylic acid/maleimide copolymers, methacrylic acid/maleimide copolymers, p-hydroxystyrene/acrylic acid/maleimide copolymers, and p-hydroxystyrene/methacrylic acid/maleimide copolymers, as well as dendritic polymers and hyperbranched polymers of the foregoing phenol derivatives.

Of these polymers, poly(p-hydroxystyrene), partially hydrogenated poly(p-hydroxystyrene) copolymers, p-hydroxystyrene/styrene copolymers, p-hydroxystyrene/acrylic acid copolymers, p-hydroxystyrene/methacrylic acid copolymers, and dendritic or hyperbranched polymers of poly(p-hydroxystyrene) are preferred.

Especially, alkali-soluble resins comprising units of the following formula (2), (2') or (2") are preferred.

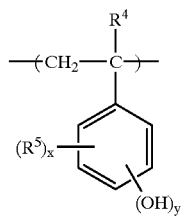

(2)

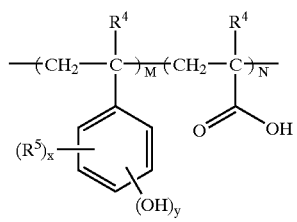

(2')

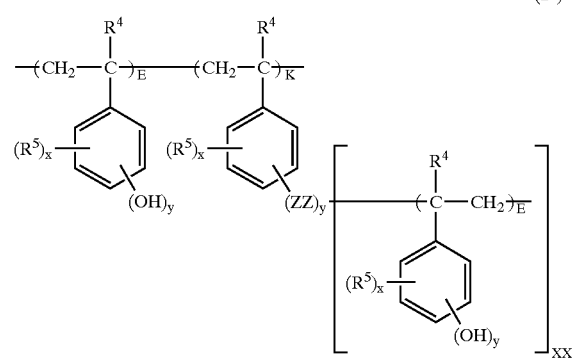

(2")

In the formulas, $R^4$ is hydrogen or methyl. $R^5$ is a straight, branched or cyclic alkyl group of 1 to 8 carbon atoms. Subscript x is 0 or a positive integer, and y is a positive integer, satisfying x+y≦5. M and N are positive integers satisfying 0<N/(M+N)≦0.5. ZZ is a divalent organic group selected from among $CH_2$, CH(OH), $CR^5$(OH), C=O, and $C(OR^5)$(OH), or a trivalent organic group represented by —C(OH)=. E, which may be the same or different, is a positive integer, and K is a positive integer, satisfying 0.001≦K/(K+E)≦0.1. XX is 1 or 2.

These alkali-soluble resins should preferably have a weight average molecular weight (Mw) of about 3,000 to about 100,000. Polymers with a Mw of less than 3,000 may perform poorly and have low heat resistance and an insufficient film forming ability. With Mw beyond 100,000, polymers may become less soluble in developers and resist solvents. The dispersity or polydispersity index (Mw/Mn) of the resin should preferably be up to 3.5, and more preferably up to 1.5. Polymers with a dispersity of more than 3.5 often have poor resolution.

It is not critical how to prepare the polymer. In the case of poly(p-hydroxystyrene) and similar polymers, living anion polymerization is recommended because a polymer having a low or narrow dispersity can be synthesized.

The dendritic or hyperbranched polymer of phenol derivative represented by formula (2″) can be synthesized by effecting living anion polymerization of a polymerizable monomer such as 4-tert-butoxystyrene and reacting a branching monomer such as chloromethylstyrene as appropriate during the living anion polymerization.

More particularly, living anion polymerization is started using a polymerizable monomer such as 4-tert-butoxystyrene. After a predetermined amount has been polymerized, a branching monomer such as chloromethylstyrene is introduced and reacted with the intermediate. Then the polymerizable monomer such as 4-tert-butoxystyrene and/or the branching monomer such as chloromethylstyrene is added again for polymerization. This operation is repeated many times until a desired dendritic or hyperbranched polymer is obtained. If necessary, the protective groups used to enable living polymerization are deblocked, yielding a dendritic or hyperbranched polymer of phenol derivative.

Examples of the branching monomer are given below.

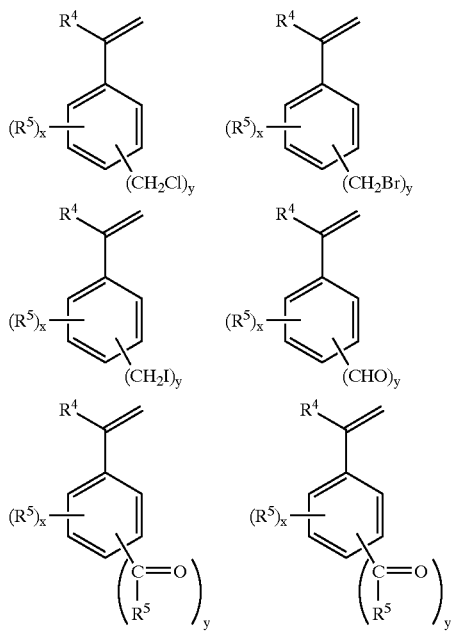

$R^4$, $R^5$, x and y are as defined above.

Illustrative examples of the dendritic or hyperbranched polymer are those having recurring units of the following approximate formulas (8) to (12).

 (8)

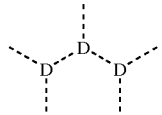 (9)

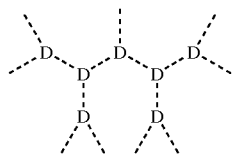 (10)

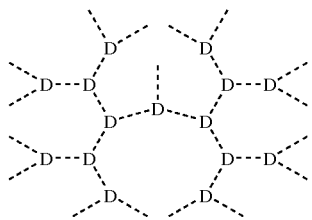 (11)

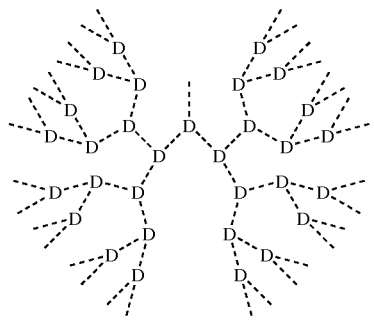 (12)

Herein, broken lines represent polymer chains of the phenol derivative monomer, and D represents units based on the branching monomer. The number of broken line segments between D and D is depicted merely for the sake of convenience, independent of the number of recurring units in the polymer chain included between D and D.

The dendritic or hyperbranched polymer of a phenol derivative is prepared by effecting living polymerization of the phenol derivative, reacting with a compound having a polymerizable moiety and a terminating moiety and proceeding further polymerization. By repeating this operation desired times, a dendritic or hyperbranched polymer of phenol derivative can be synthesized. The living polymerization may be effected by any desired technique although living anion polymerization is preferred because of ease of control.

For living anion polymerization to take place, the reaction solvent is preferably selected from toluene, benzene, tetrahydrofuran, dioxane, and diethyl ether. Of these, polar solvents such as tetrahydrofuran, dioxane, and diethyl ether are preferable. They may be used alone or in admixture of two or more.

The initiator used herein is preferably selected from sec-butyl lithium, n-butyl lithium, naphthalene sodium and cumyl potassium. The amount of the initiator used is proportional to the design molecular weight.

Preferred reaction conditions include a temperature of −80° C. to 100° C., preferably −70° C. to 0° C., and a time of about 0.1 to 50 hours, preferably about 0.5 to 5 hours.

One exemplary reaction scheme using sec-butyl lithium as the initiator and 4-chloromethylstyrene as the branching monomer is shown below. The branching coefficient can be altered by repeating the reaction step any desired times.

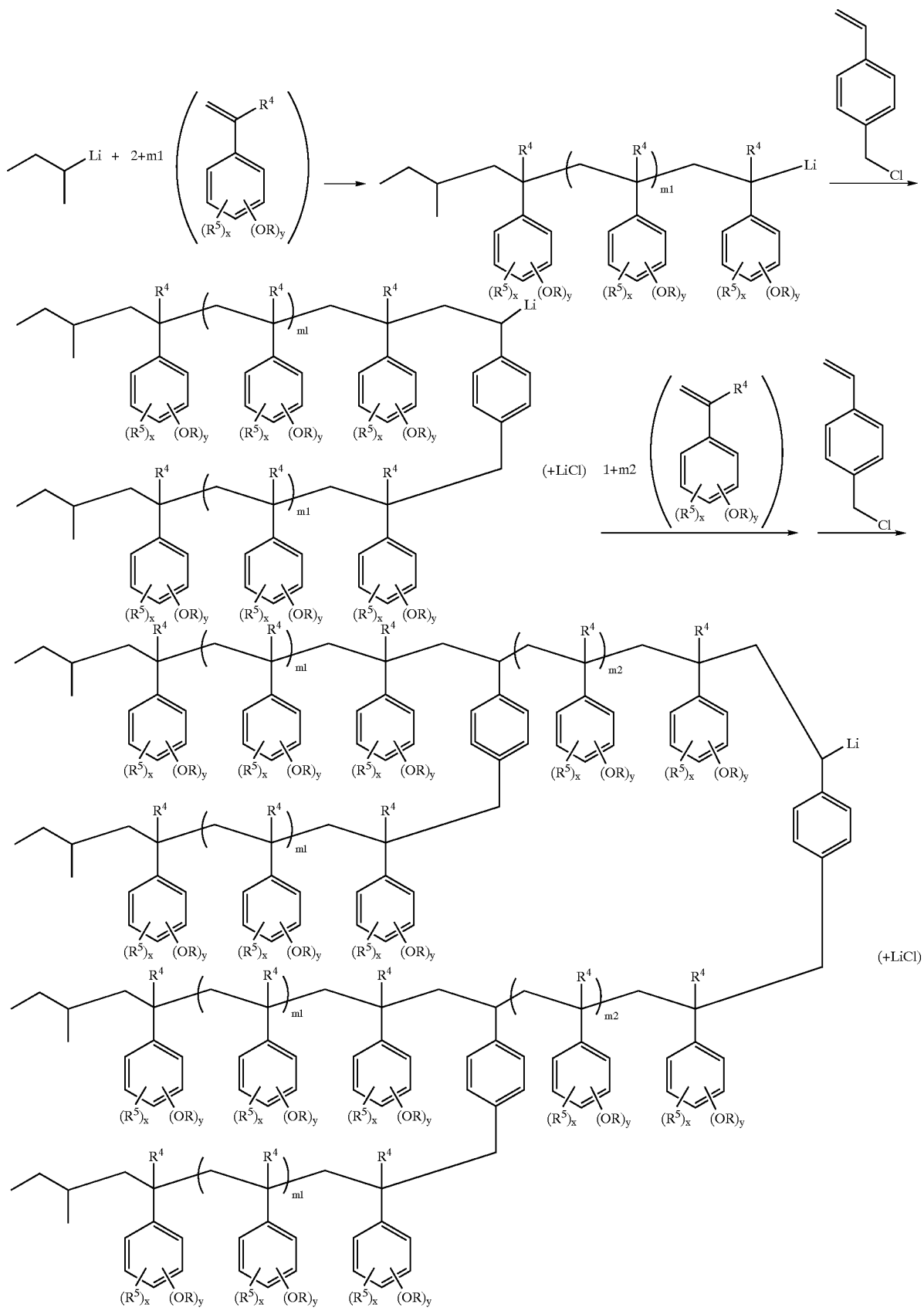

Herein, $R^4$, $R^5$, x and y are as defined above, $m_1$ and $m_2$ each are 0 or a positive integer, and R is a substituent capable of withstanding living anion polymerization.

The living polymer thus obtained is deactivated or stopped, and the substituent R which has been introduced for the progress of living anion polymerization is deprotected, obtaining an alkali-soluble resin.

While the resin capable of changing its solubility in an alkali developer under the action of acid (B) which is formulated in the chemical amplification positive resist composition has substituents of the formula (1), the proportion of substituents (1) in the resin is preferably about 1 to 40 mol % based on the phenolic hydroxyl groups and/or carboxyl groups in the starting alkali-soluble resin. The proportion of substituents (1) is more preferably about 5 to 30 mol %, and most preferably about 10 to 25 mol %. If the proportion of substituents (1) is more than 40 mol %, there may often arise problems with respect to resist solubility and particle. A proportion of substituents (1) less than 1 mol % may often fail to exert the effects of the invention.

More illustrative examples are polymers comprising recurring units of the above formula (2) or (2') wherein the hydrogen atoms on phenolic hydroxyl groups are replaced by substituents of the above formula (1) in a proportion of more than 1 mol % to 40 mol %, on average, based on the entire hydrogen atoms on phenolic hydroxyl groups, the polymers having a weight average molecular weight of about 3,000 to about 100,000.

Alternatively, polymers comprising recurring units of the above formula (2'), specifically copolymers comprising p-hydroxystyrene and/or α-methyl-p-hydroxystyrene and acrylic acid and/or methacrylic acid, are useful wherein the hydrogen atoms on carboxyl groups in the acrylic acid and/or methacrylic acid are replaced by substituents of the above formula (1) or other acid labile groups, and units based on acrylate and/or methacrylate are present in the polymer in a proportion from more than 1 mol % to 40 mol % on average, and some of the hydrogen atoms on phenolic hydroxyl groups in the p-hydroxystyrene and/or α-methyl-p-hydroxystyrene may be replaced by substituents of the above formula (1). More preferably, the units based on acrylate and/or methacrylate and the units based on p-hydroxystyrene and/or α-methyl-p-hydroxystyrene having substituents of formula (1) are present in the polymer in a total proportion from more than 1 mol % to 40 mol % on average.

Such polymers are exemplified by those polymers comprising recurring units of the following general formula (2a), (2a') or (2a") and having a weight average molecular weight of about 3,000 to about 100,000.

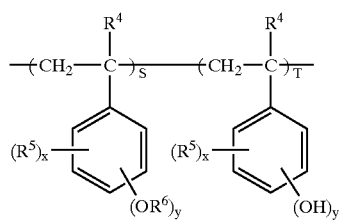
(2a)

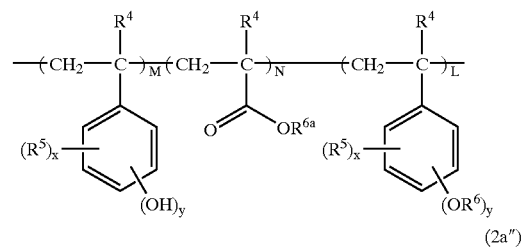
(2a')

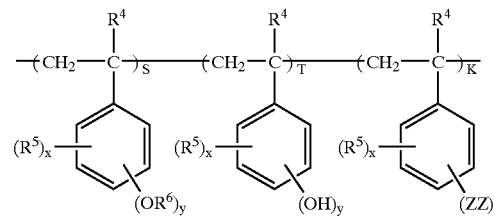
(2a")

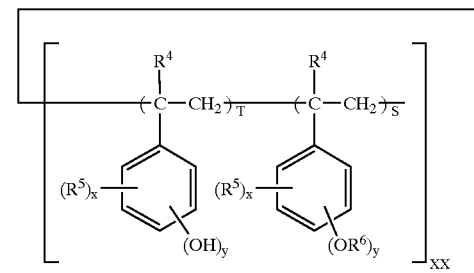

In the formulas, $R^4$ is hydrogen or methyl. $R^5$ is a straight, branched or cyclic alkyl group of 1 to 8 carbon atoms. $R^6$ is a substituent of the above formula (1). $R^{6a}$ is hydrogen or a substituent of formula (1) and/or an acid labile group, and at least some, preferably all, of the $R^{6a}$ groups are substituents of formula (1) and/or acid labile groups. Subscript x is 0 or a positive integer, and y is a positive integer, satisfying $x+y \leq 5$. S and T are positive integers, satisfying $0.01 \leq S/(S+T) \leq 0.4$. The $R^6$ groups may be the same or different when y is 2 or more. M and N are positive integers, and L is 0 or a positive integer, satisfying $0 < N/(M+N) \leq 0.4$ and $0.01 \leq (N+L)/(M+N+L) \leq 0.4$. ZZ is a divalent organic group selected from among $CH_2$, $CH(OH)$, $CR^5(OH)$, $C=O$, and $C(OR^5)(OH)$, or a trivalent organic group represented by —C(OH)=. K is a positive integer, satisfying $0.001 \leq K/(K+S+T) \leq 0.1$. XX is 1 or 2. The acid labile groups will be described later.

Examples of the straight, branched or cyclic alkyl group of 1 to 8 carbon atoms represented by $R^5$ include methyl, ethyl, propyl, isopropyl, n-butyl, isobutyl, tert-butyl, cyclohexyl and cyclopentyl.

As compared with conventional resins based on linear polymers, the resin which changes its solubility in an alkali developer under the action of acid, obtained by introducing substituents of formula (1) into the dendritic or hyperbranched polymer, has the advantage that the performance of chemical amplification positive resist compositions is improved due to the effects of polymer branching and increased free volume.

The advantages inherent to the invention are derived by introducing substituents of formula (1) into an alkali-soluble resin while the resist performance is dictated by the properties of the original alkali-soluble resin prior to substitution.

Therefore, the original alkali-soluble resin should be selected in accordance with the desired properties.

For example, the dendritic or hyperbranched polymers have a smaller molecular size than linear polymers, which leads to an improved resolution. When it is desired to improve heat resistance by increasing the molecular weight of the polymer, this can be accomplished without increasing the viscosity, which leads to an improved process stability. The dendritic polymers have an increased number of terminuses, which is effective for improving adhesion to substrates.

It is believed that these advantages are due to the effects of entanglement between polymers. It is believed that polymers are not kept separate, but form a cluster. In the case of greater or stronger clusters, their size or strength affects the resolution and edge roughness. It is understood that a linear polymer increases the degree of entanglement in proportion to the backbone length and forms a greater or stronger cluster. By contrast, the dendritic or hyperbranched polymer gives rise to the entanglement of polymer segments corresponding to the length of branches, independent of the overall length of the polymer, and as a consequence, the likelihood of entanglement between polymers themselves is retarded. This leads to the advantages of improved resolution, minimized increase of viscosity even in the case of high molecular weight one, and improved adhesion.

The resin which changes its solubility in an alkali developer under the action of acid, obtained by introducing substituents of formula (1) into the dendritic or hyperbranched polymer, preferably has a weight average molecular weight of about 5,000 to about 100,000 and a number of branches of 0.001 to 0.1, based on the entire monomer units constituting the polymer.

For the synthesis of the resin which changes its solubility in an alkali developer under the action of acid and has substituents of formula (1), preferably phenolic hydroxyl groups and/or carboxyl groups in the alkali-soluble resin are reacted with a propenyl ether such as cyclohexyl propenyl ether or cyclohexyl methyl propenyl ether under acidic conditions. Also preferably, synthesis is carried out by reacting the alkali-soluble resin with cyclohexyl or cyclohexylmethyl 1-halogenated propyl ether such as cyclohexyl 1-chloropropyl ether, cyclohexyl 1-bromopropyl ether, cyclohexylmethyl 1-chloropropyl ether or cyclohexylmethyl 1-bromopropyl ether under basic conditions.

The propenyl ethers can be synthesized in a conventional way while referring to Greene, "Protective Groups in Organic Synthesis," John Wiley & Sons, 1981. Specifically, cyclohexyl alcohol or cyclohexyl methyl alcohol is reacted with allyl chloride or allyl bromide under basic conditions to form an allyl ether. Alternatively, cyclohexyl chloride or cyclohexyl methyl chloride is reacted with allyl alcohol under basic conditions to form an allyl ether. Next, the allyl ether is isomerized through rearrangement into a propenyl ether. Further, hydrogen chloride or hydrogen bromide is added to the propenyl ether to form a cyclohexyl or cyclohexylmethyl 1-halogenated propyl ether.

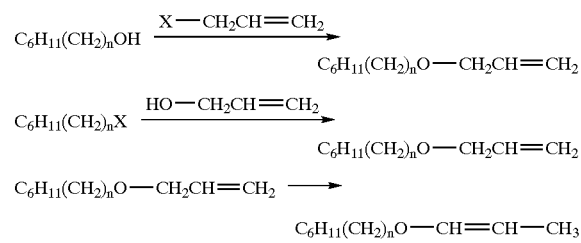

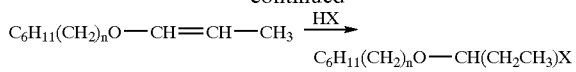

In the formulas, $C_6H_{11}$ is cyclohexyl, n is as defined above, and X is chlorine, bromine or iodine.

While the resin capable of changing its solubility in an alkali developer under the action of acid (B) which is formulated in the chemical amplification positive resist composition has substituents of the formula (1), it may further have acid labile groups of one or more types. The total of substituents of formula (1) and other acid labile groups is preferably 1 to 80 mol % based on the phenolic hydroxyl groups and/or carboxyl groups in the original alkali-soluble resin. This total is more preferably 5 to 50 mol %, and most preferably 10 to 40 mol %.

Provided that the proportion of substituents of formula (1) relative to the phenolic hydroxyl groups and/or carboxyl groups in the alkali-soluble resin is A mol % and the proportion of other acid labile groups relative to the phenolic hydroxyl groups and/or carboxyl groups is B mol %, it is recommended that A/(A+B) range from 0.1 to 1, more preferably from 0.3 to 1, and most preferably from 0.5 to 1.

The acid labile groups other than formula (1) are preferably groups of the following general formulae (4) to (7), tertiary alkyl groups of 4 to 20 carbon atoms, preferably 4 to 15 carbon atoms, trialkylsilyl groups whose alkyl groups each have 1 to 6 carbon atoms, or oxoalkyl groups of 4 to 20 carbon atoms.

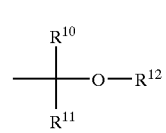

(4)

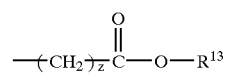

(5)

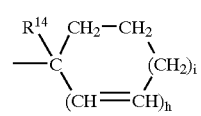

(6)

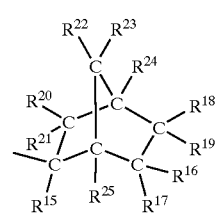

(7)

Herein $R^{10}$ and $R^{11}$ are independently hydrogen or straight, branched or cyclic alkyl groups of 1 to 18 carbon atoms, preferably 1 to 10 carbon atoms, for example, methyl, ethyl, propyl, isopropyl, n-butyl, sec-butyl, tert-butyl, cyclopentyl, cyclohexyl, 2-ethylhexyl and n-octyl. $R^{12}$ is a monovalent hydrocarbon group of 1 to 18 carbon atoms, preferably 1 to 10 carbon atoms, which may have a hetero atom (e.g., oxygen atom), for example, straight, branched or cyclic alkyl groups, and such groups in which some hydrogen atoms are replaced by hydroxyl, alkoxy, oxo, amino or alkylamino groups. Illustrative examples of the substituted alkyl groups are given below.

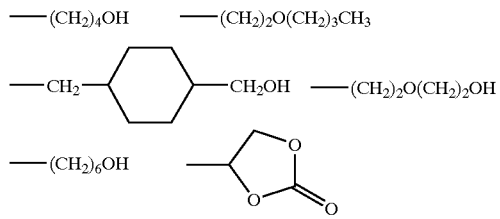

A pair of $R^{10}$ and $R^{11}$, a pair of $R^{10}$ and $R^{12}$, or a pair of $R^{11}$ and $R^{12}$, taken together, may form a ring. Each of $R^{10}$, $R^{11}$ and $R^{12}$ is a straight or branched alkylene group of 1 to 18 carbon atoms, preferably 1 to 10 carbon atoms, when they form a ring.

$R^{13}$ is a tertiary alkyl group of 4 to 20 carbon atoms, preferably 4 to 15 carbon atoms, a trialkylsilyl group whose alkyl groups each have 1 to 6 carbon atoms, an oxoalkyl group of 4 to 20 carbon atoms or a group of formula (4). Exemplary tertiary alkyl groups are tert-butyl, tert-amyl, 1,1-diethylpropyl, 1-methylcyclopentyl, 1-ethylcyclopentyl, 1-isopropylcyclopentyl, 1-butylcyclopentyl, 1-methylcyclohexyl, 1-ethylcyclohexyl, 1-isopropylcyclohexyl, 1-butylcyclohexyl, 1-ethyl-2-cyclopentenyl, 1-ethyl-2-cyclohexenyl, and 2-methyl-2-adamantyl. Exemplary trialkylsilyl groups are trimethylsilyl, triethylsilyl, and dimethyl-tert-butylsilyl. Exemplary oxoalkyl groups are 3-oxocyclohexyl, 4-methyl-2-oxooxan-4-yl, and 5-methyl-5-oxooxoran-4-yl. Letter z is an integer of 0 to 6.

$R^{14}$ is a straight, branched or cyclic alkyl group of 1 to 8 carbon atoms or substituted or unsubstituted aryl group of 6 to 20 carbon atoms. Exemplary straight, branched or cyclic alkyl groups include methyl, ethyl, propyl, isopropyl, n-butyl, sec-butyl, tert-butyl, tert-amyl, n-pentyl, n-hexyl, cyclopentyl, cyclohexyl, cyclopentylmethyl, cyclopentylethyl, cyclohexylmethyl and cyclohexylethyl. Exemplary substituted or unsubstituted aryl groups include phenyl, methylphenyl, naphthyl, anthryl, phenanthryl, and pyrenyl. Letter h is equal to 0 or 1, i is equal to 0, 1, 2 or 3, satisfying 2h+i=2 or 3.

$R^{15}$ is a straight, branched or cyclic alkyl group of 1 to 8 carbon atoms or substituted or unsubstituted aryl group of 6 to 20 carbon atoms, examples of which are as exemplified for $R^{14}$. $R^{16}$ to $R^{25}$ are independently hydrogen or monovalent hydrocarbon groups of 1 to 15 carbon atoms which may contain a hetero atom, for example, straight, branched or cyclic alkyl groups such as methyl, ethyl, propyl, isopropyl, n-butyl, sec-butyl, tert-butyl, tert-amyl, n-pentyl, n-hexyl, n-octyl, n-nonyl, n-decyl, cyclopentyl, cyclohexyl, cyclopentylmethyl, cyclopentylethyl, cyclopentylbutyl, cyclohexylmethyl, cyclohexylethyl, and cyclohexylbutyl, and substituted ones of these groups in which some hydrogen atoms are replaced by hydroxyl, alkoxy, carboxy, alkoxycarbonyl, oxo, amino, alkylamino, cyano, mercapto, alkylthio, and sulfo groups. $R^{16}$ to $R^{25}$, for example, a pair of $R^{16}$ and $R^{17}$, a pair of $R^{16}$ and $R^{18}$, a pair of $R^{17}$ and $R^{19}$, a pair of $R^{18}$ and $R^{19}$, a pair of $R^{20}$ and $R^{21}$, or a pair of $R^{22}$ and $R^{23}$, taken together, may form a ring. When $R^{16}$ to $R^{26}$ form a ring, they are divalent hydrocarbon groups which may contain a hetero atom, examples of which are the above-exemplified monovalent hydrocarbon groups with one hydrogen atom eliminated. Also, two of $R^{16}$ to $R^{25}$ which are attached to adjacent carbon atoms (for example, a pair of $R^{16}$ and $R^{18}$, a pair of $R^{18}$ and $R^{24}$, or a pair of $R^{22}$ and $R^{24}$) may directly bond together to form a double bond.

Of the acid labile groups of formula (4), illustrative examples of the straight or branched groups are given below.

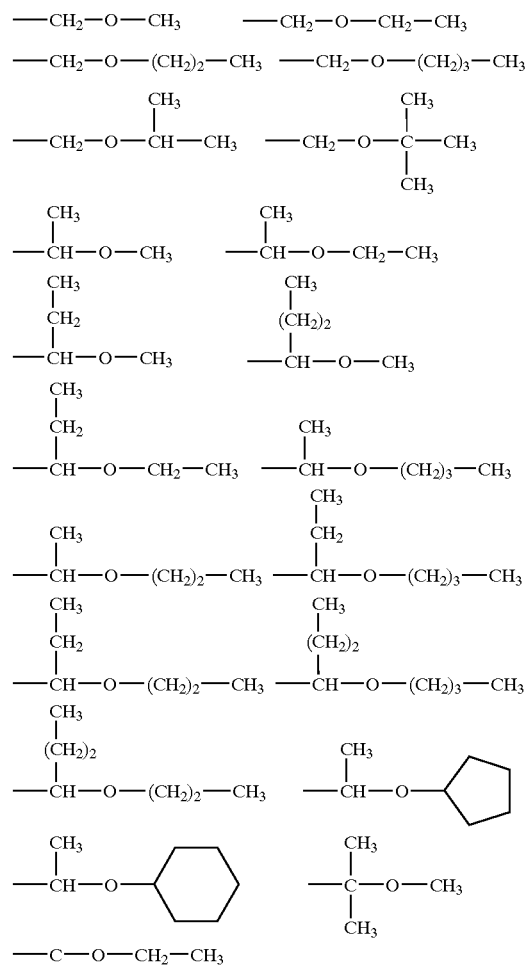

Of the acid labile groups of formula (4), illustrative examples of the cyclic groups include tetrahydrofuran-2-yl, 2-methyltetrahydrofuran-2-yl, tetrahydropyran-2-yl and 2-methyltetrahydropyran-2-yl.

Illustrative examples of the acid labile groups of formula (5) include tert-butoxycarbonyl, tert-butoxycarbonylmethyl, tert-amyloxycarbonyl, tert-amyloxycarbonyl-methyl, 1,1-diethylpropyloxycarbonyl, 1,1-diethylpropyloxycarbonylmethyl, 1-ethylcyclopentyloxycarbonyl, 1-ethylcyclopentyloxycarbonylmethyl, 1-ethyl-2-cyclopentenyloxycarbonyl, 1-ethyl-2-cyclopentenyl-oxycarbonylmethyl, 1-ethoxyethoxycarbonylmethyl, 2-tetrahydropyranyloxycarbonylmethyl, and 2-tetrahydrofuranyloxycarbonylmethyl.

Illustrative examples of the acid labile groups of formula (6) include 1-methylcyclopentyl, 1-ethylcyclopentyl, 1-n-propylcyclopentyl, 1-isopropylcyclopentyl, 1-n-butylcyclopentyl, 1-sec-butylcyclopentyl, 1-methylcyclohexyl, 1-ethylcyclohexyl, 3-methyl-1-cyclopenten-3-yl, 3-ethyl-1-cyclopenten-3-yl, 3-methyl-1-cyclohexen-3-yl, and 3-ethyl-1-cyclohexen-3-yl.

Illustrative examples of the acid labile groups of formula (7) are given below.

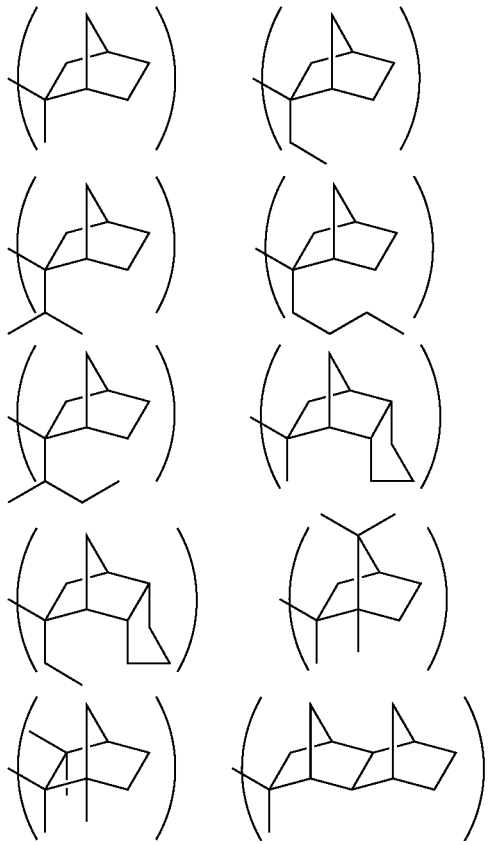

Exemplary of the tertiary alkyl group of 4 to 20 carbon atoms, preferably 4 to 15 carbon atoms, are tert-butyl, tert-amyl, 3-ethyl-3-pentyl and dimethylbenzyl.

Exemplary of the trialkylsilyl groups whose alkyl groups each have 1 to 6 carbon atoms are trimethylsilyl, triethylsilyl, and tert-butyldimethylsilyl.

Exemplary of the oxoalkyl groups of 4 to 20 carbon atoms are 3-oxocyclohexyl and groups represented by the following formulae.

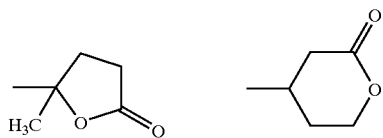

In an alternative embodiment, the resin capable of changing its solubility in an alkali developer under the action of acid and having substituents of the formula (1) is a polymer comprising units of formula (2), (2') or (2") in which some of the hydrogen atoms on phenolic hydroxyl groups are crosslinked within a molecule and/or between molecules in a proportion of more than 0 mol % to 50 mol %, on the average, of the entire phenolic hydroxyl groups in the polymer, with crosslinking groups having C—O—C linkages represented by the following general formula (3a) or (3b).

The crosslinking groups having C—O—C linkages may be groups represented by the following general formula (3a) or (3b), preferably the following general formula (3a') or (3b').

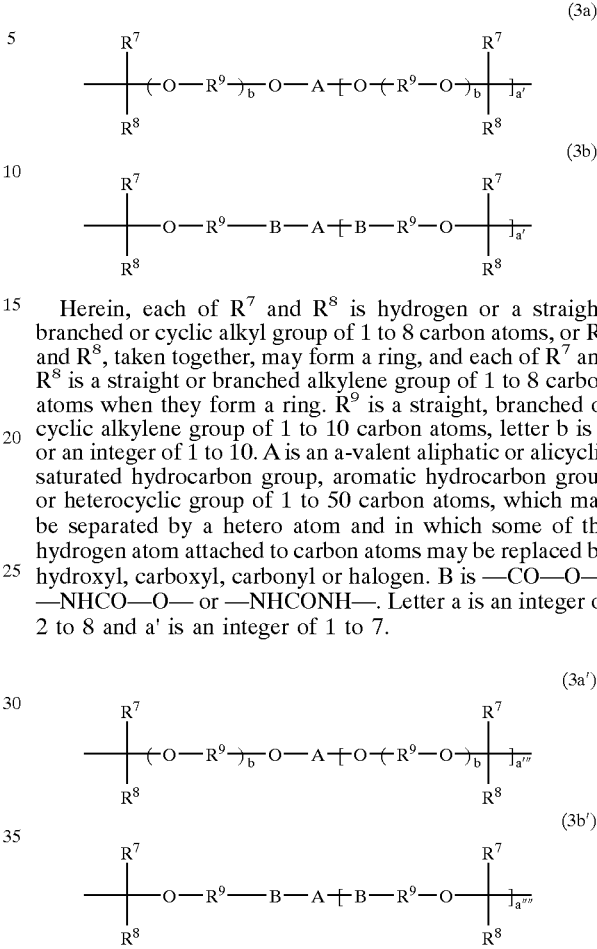

Herein, each of $R^7$ and $R^8$ is hydrogen or a straight, branched or cyclic alkyl group of 1 to 8 carbon atoms, or $R^7$ and $R^8$, taken together, may form a ring, and each of $R^7$ and $R^8$ is a straight or branched alkylene group of 1 to 8 carbon atoms when they form a ring. $R^9$ is a straight, branched or cyclic alkylene group of 1 to 10 carbon atoms, letter b is 0 or an integer of 1 to 10. A is an a-valent aliphatic or alicyclic saturated hydrocarbon group, aromatic hydrocarbon group or heterocyclic group of 1 to 50 carbon atoms, which may be separated by a hetero atom and in which some of the hydrogen atom attached to carbon atoms may be replaced by hydroxyl, carboxyl, carbonyl or halogen. B is —CO—O—, —NHCO—O— or —NHCONH—. Letter a is an integer of 2 to 8 and a' is an integer of 1 to 7.

Herein, each of $R^7$ and $R^8$ is hydrogen or a straight, branched or cyclic alkyl group of 1 to 8 carbon atoms, or $R^7$ and $R^8$, taken together, may form a ring, and each of $R^7$ and $R^8$ is a straight or branched alkylene group of 1 to 8 carbon atoms when they form a ring. $R^9$ is a straight, branched or cyclic alkylene group of 1 to 10 carbon atoms, letter b is 0 or an integer of 1 to 5. A is an a"-valent straight, branched or cyclic alkylene, alkyltriyl or alkyltetrayl group of 1 to 20 carbon atoms or arylene group of 6 to 30 carbon atoms, which may be separated by a hetero atom and in which some of the hydrogen atom attached to carbon atoms may be replaced by hydroxyl, carboxyl, acyl or halogen. B is —CO—O—, —NHCO—O— or —NHCONH—. Letter a" is an integer of 2 to 4 and a'" is an integer of 1 to 3.

Examples of the straight, branched or cyclic $C_{1-8}$ alkyl group represented by $R^7$ and $R^8$ are as exemplified for $R^5$.

Examples of the straight, branched or cyclic $C_{1-10}$ alkylene group represented by $R^9$ include methylene, ethylene, propylene, isopropylene, n-butylene, isobutylene, cyclohexylene, and cyclopentylene.

Exemplary halogen atoms are fluorine, chlorine, bromine and iodine.

Illustrative examples of A are described later. These crosslinking groups of formulae (3a) and (3b) originate from alkenyl ether compounds and halogenated alkyl ether compounds to be described later.

As understood from the value of a' in formula (3a) or (3b), the crosslinking group is not limited to a divalent one and trivalent to octavalent groups are acceptable. For example, the divalent crosslinking group is exemplified by groups of the following formulas (3a″) and (3b″), and the trivalent crosslinking group is exemplified by groups of the following formulas (3a‴) and (3b‴).

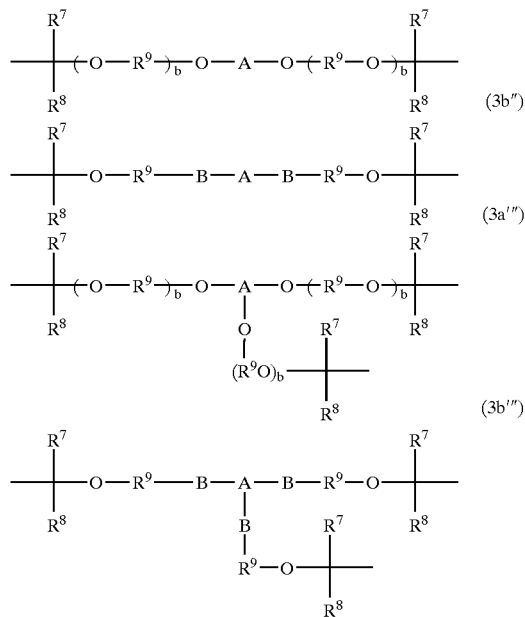

$R^7$, $R^8$, $R^9$, A, B and b are as defined above.

In a further alternative embodiment, the resin capable of changing its solubility in an alkali developer under the action of acid and having substituents of the formula (1) is a polymer comprising recurring units of the following general formula (2b), (2b′) or (2b″), and more preferably the same polymer in which hydrogen atoms on phenolic hydroxyl groups represented by R are eliminated to leave oxygen atoms which are crosslinked within a molecule and/or between molecules with crosslinking groups having C—O—C linkages represented by the above formula (3a) or (3b).

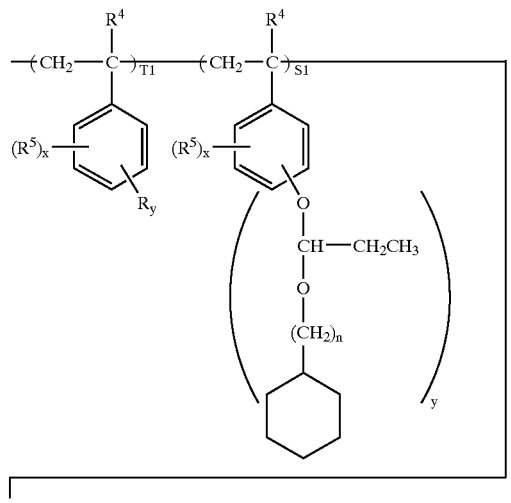

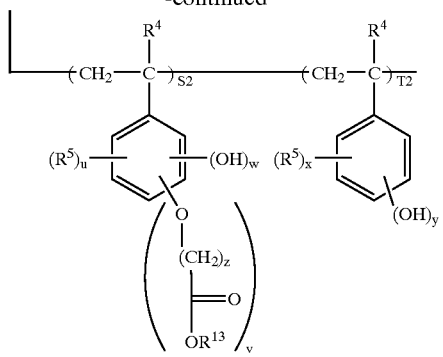

Herein, R represents an acid labile group, attached to an oxygen atom, other than the substituent of formula (1) or a crosslinking group having C—O—C linkages, attached to an oxygen atom, represented by the above formula (3a) or (3b). $R^4$ is hydrogen or methyl, $R^5$ is a straight, branched or cyclic alkyl group of 1 to 8 carbon atoms. $R^{13}$ is a tertiary alkyl group of 4 to 20 carbon atoms, an aryl-substituted alkyl group of 7 to 20 carbon atoms, an oxoalkyl group of 4 to 20 carbon atoms or a group represented by —$CR^{10}R^{11}OR^{12}$. $R^{10}$ and $R^{11}$ are independently hydrogen or straight, branched or cyclic alkyl groups of 1 to 18 carbon atoms, $R^{12}$ is a monovalent hydrocarbon group of 1 to 18 carbon atoms which may have a hetero atom, or $R^{10}$ and $R^{11}$, $R^{10}$ and $R^{12}$, or $R^{11}$ and $R^{12}$, taken together, may form a ring, with the proviso that each of $R^{10}$, $R^{11}$ and $R^{12}$ is a straight or branched alkylene group of 1 to 18 carbon atoms when they form a ring. Letter z is an integer of 0 to 6. S1 is a positive number, each of S2, T1, and T2 is 0 or a positive number, satisfying $0 \leq T1/(S1+T1+T2+S2) \leq 0.8$, $0.01 \leq S1/(S1+T1+T2+S2) \leq 0.4$, $0 \leq T2/(S1+T1+T2+S2) \leq 0.09$, and $0.01 \leq (S1+S2)/(S1+T1+T2+S2) \leq 0.8$. Each of u and w is 0 or a positive integer, and v is a positive integer, satisfying $u+v+w \leq 5$. Letters m, x and y are as defined above.

More preferably, S1, S2, T1 and T2 satisfy the ranges: $0 \leq T1/(S1+T1+T2+S2) \leq 0.3$, $0.05 \leq S1/(S1+T1+T2+S2) \leq 0.3$, $0 \leq S2/(S1+T1+T2+S2) \leq 0.3$, $0.5 \leq T2/(S1+T1+T2+S2) \leq 0.95$, and $0.05 \leq (S1+S2)/(S1+T1+T2+S2) \leq 0.5$; and most preferably, $0 \leq T1/(S1+T1+T2+S2) \leq 0.15$, $0.1 \leq S1/(S1+T1+T2+S2) \leq 0.25$, $0 \leq S2/(S1+T1+T2+S2) \leq 0.15$, $0.5 \leq T2/(S1+T1+T2+S2) \leq 0.9$, and $0.1 \leq (S1+S2)/(S1+T1+T2+S2) \leq 0.4$.

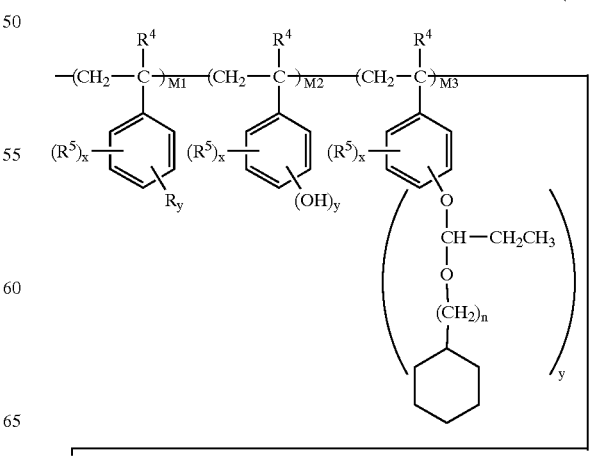

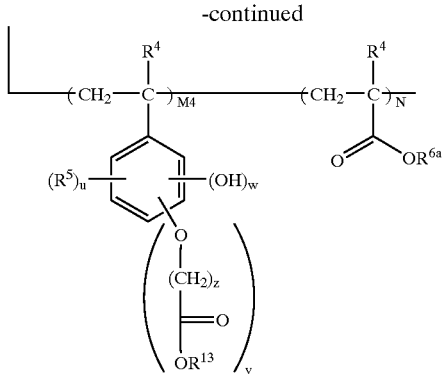

Herein, R represents an acid labile group, attached to an oxygen atom, other than the substituent of formula (1) or a crosslinking group having C—O—C linkages, attached to an oxygen atom, represented by the above formula (3a) or (3b). $R^4$ is hydrogen or methyl, $R^5$ is a straight, branched or cyclic alkyl group of 1 to 8 carbon atoms. $R^{6a}$ is hydrogen, a substituent of formula (1) or an acid labile group as mentioned above, and at least some, preferably all of the $R^{6a}$ groups are acid labile groups. $R^{13}$ is a tertiary alkyl group of 4 to 20 carbon atoms, an aryl-substituted alkyl group of 7 to 20 carbon atoms, an oxoalkyl group of 4 to 20 carbon atoms or a group represented by —$CR^{10}R^{11}OR^{12}$. $R^{10}$ and $R^{11}$ are independently hydrogen or straight, branched or cyclic alkyl groups of 1 to 18 carbon atoms, $R^{12}$ is a monovalent hydrocarbon group of 1 to 18 carbon atoms which may have a hetero atom, or $R^{10}$ and $R^{11}$, $R^{10}$ and $R^{12}$, or $R^{11}$ and $R^{12}$, taken together, may form a ring, with the proviso that each of $R^{10}$, $R^{11}$ and $R^{12}$ is a straight or branched alkylene group of 1 to 18 carbon atoms when they form a ring. Letter z is an integer of 0 to 6. Letters n, u, w, v, x and y are as defined above.

N is a positive number, each of M1, M2, M3 and M4 is 0 or a positive number, satisfying $0<N/(M1+M2+M3+M4+N)\leq0.4$, $0.01\leq(M3+N)/(M1+M2+M3+M4+N)\leq0.5$, $0\leq M2/(M1+M2+M3+M4+N)\leq0.99$, and $M1+M2+M3+M4+N=1$. M1, M3 and M4 are not equal to 0 at the same time. More preferably, N, M1, M2, M3 and M4 satisfy the ranges: $0<N/(M1+M2+M3+M4+N)\leq0.3$, $0.05\leq(M3+N)/(M1+M2+M3+M4+N)\leq0.4$, and $0.5\leq M2/(M1+M2+M3+M4+N)\leq0.95$, and most preferably, $0<N/(M1+M2+M3+M4+N)\leq0.3$, $0.1\leq(M3+N)/(M1+M2+M3+M4+N)\leq0.3$, and $0.6\leq M2/(M1+M2+M3+M4+N)\leq0.9$.

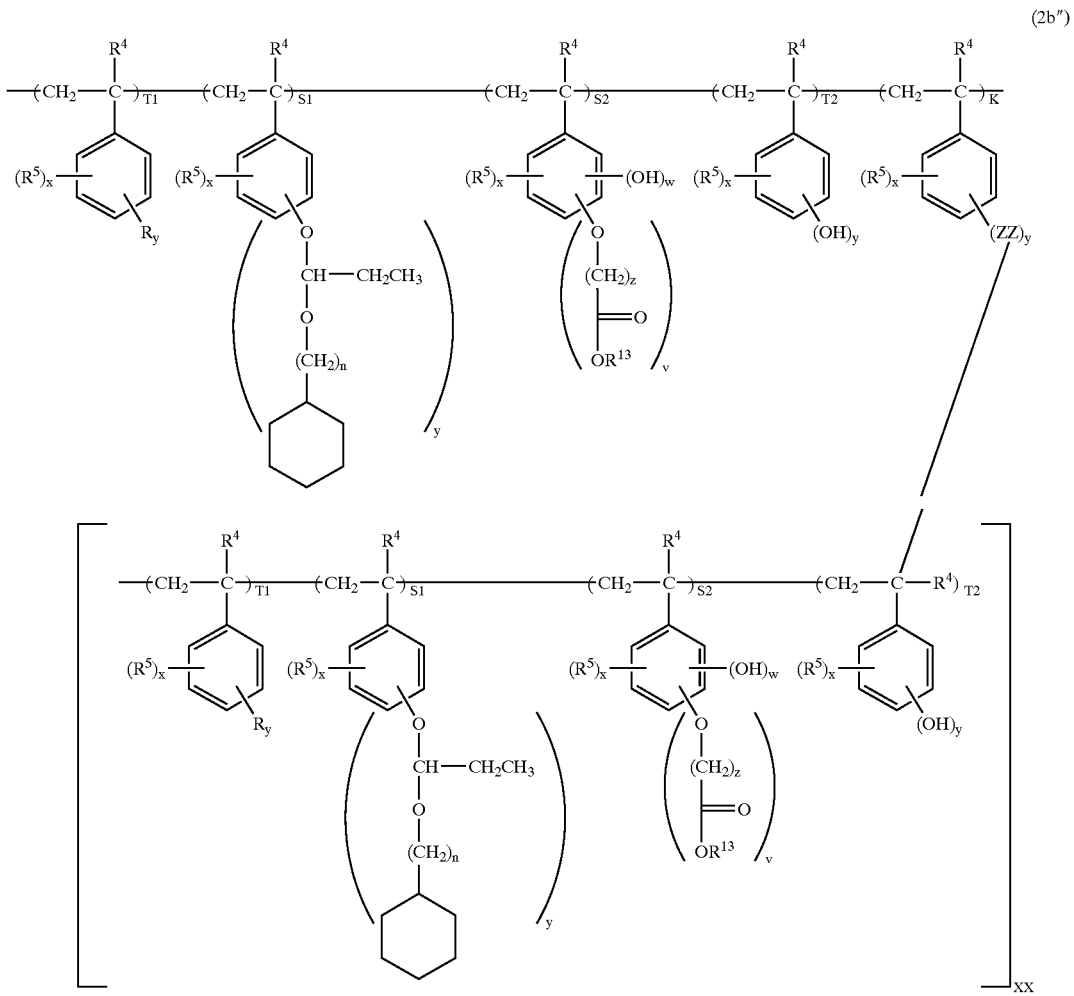

(2b″)

In the formula, R, $R^4$, $R^5$, $R^{13}$, $R^{10}$, $R^{11}$, $R^{12}$ z, S1, S2, T1, T2, u, w, v, n, x and y are as defined above. ZZ is a divalent organic group selected from the group consisting of $CH_2$, $CH(OH)$, $CR^5(OH)$, $C=O$, and $C(OR^5)(OH)$, or a trivalent organic group represented by $-C(OH)=$. XX is 1 or 2. K is a positive integer satisfying $0.001 \leq K/(S1+T1+T2+S2+K) \leq 0.1$.

In the embodiment wherein the resin (B) capable of changing its solubility in an alkali developer under the action of acid and having substituents of the formula (1) is crosslinked with acid labile substituents, specifically crosslinked within a molecule and/or between molecules with crosslinking groups having C—O—C linkages resulting from reaction of phenolic hydroxyl groups with an alkenyl ether compound or halogenated alkyl ether, the proportion of crosslinking groups having C—O—C linkages is preferably, on the average, from more than 0 mol % to 20 mol %, more preferably from 0.2 mol % to 10 mol %. At 0 mol %, few benefits of the crosslinking group would be obtained, resulting in a reduced contrast of alkali dissolution rate and a low resolution. With more than 20 mol %, a too much crosslinked polymer would gel, become insoluble in alkali, induce a film thickness change, internal stresses or bubbles upon alkali development, and lose adhesion to the substrate due to less hydrophilic groups.

The total proportion of substituents of formula (1) and acid labile groups is preferably, on the average, more than 0 mol % to 50 mol %, especially 10 to 40 mol %. At 0 mol %, there result a reduced contrast of alkali dissolution rate and a low resolution. With more than 50 mol %, the polymer may lose alkali solubility or affinity to an alkali developer upon development and have poor resolution.

By properly selecting the proportions of crosslinking groups having C—O—C linkages and acid labile groups within the above-defined ranges, it becomes possible to control the size and configuration of a resist pattern as desired. In the resist composition according to the invention, the contents of crosslinking groups having C—O—C linkages and acid labile groups in the polymer have substantial influence on the dissolution rate contrast of a resist film and govern the properties of the resist composition relating to the size and configuration of a resist pattern.

Now A in the crosslinking group is described. The (a'+1)-valent organic groups represented by A include hydrocarbon groups, for example, substituted or unsubstituted alkylene groups preferably having 1 to 50 carbon atoms, and especially 1 to 40 carbon atoms, substituted or unsubstituted arylene groups preferably having 6 to 50 carbon atoms, and especially 6 to 40 carbon atoms (these alkylene and arylene groups may have an intervening hetero atom or group such as O NH, $N(CH_3)$, S or $SO_2$, and where substituted, the substituents are hydroxyl, carboxyl, acyl and fluorine), and combinations of these alkylene groups with these arylene groups, and a'-valent groups corresponding to the foregoing groups from which a hydrogen atom attached to a carbon atom is eliminated (wherein a' is an integer of 3 to 8). Additional examples include (a'+1)-valent heterocyclic groups, and combinations of these heterocyclic groups with the foregoing hydrocarbon groups.

Illustrative examples of A are given below.

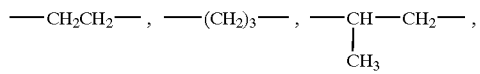

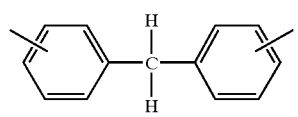
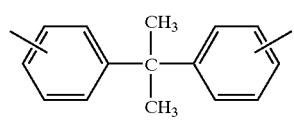
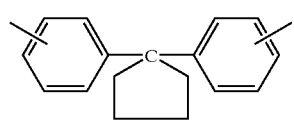
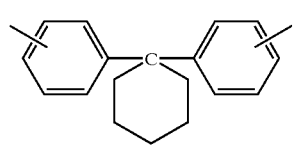
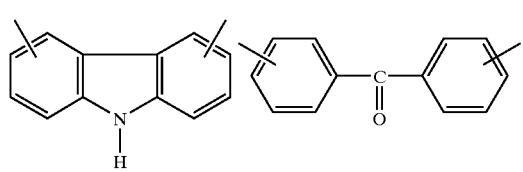
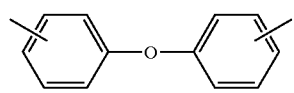
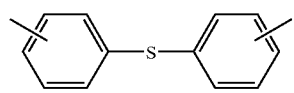
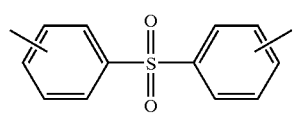
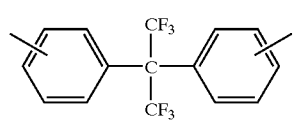
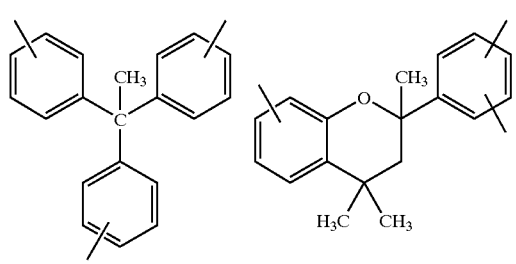
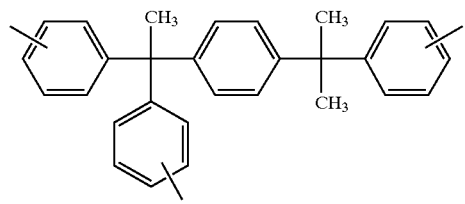
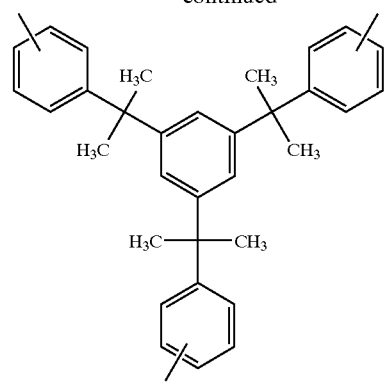
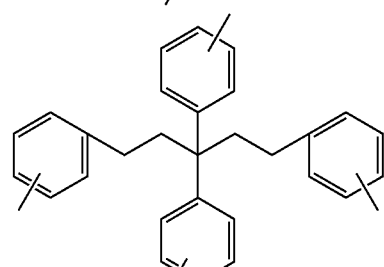
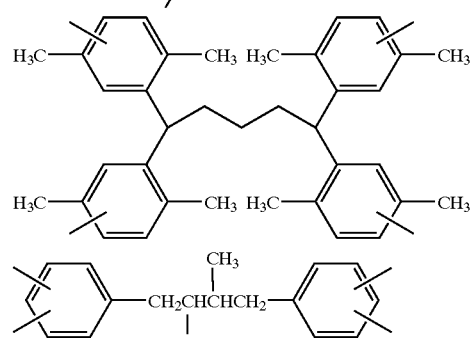
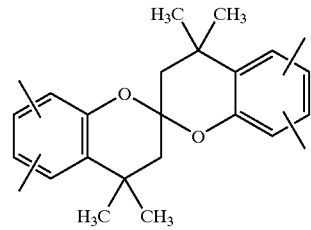
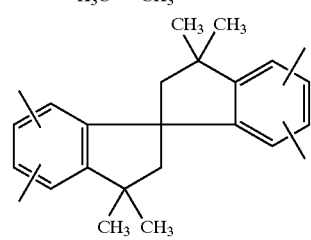
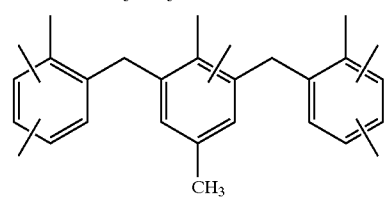

Preferably, in formula (3a), $R^7$ is methyl, $R^8$ is hydrogen, b is equal to 0, and A is ethylene, 1,4-butylene or 1,4-cyclohexylene.

In preparing the polymer which is crosslinked within a molecular and/or between molecules with crosslinking groups having C—O—C linkages, synthesis can be made by reacting a corresponding non-crosslinked polymer with an alkenyl ether in the presence of an acid catalyst in a conventional manner.

Alternatively, where decomposition of other acid labile groups takes place in the presence of an acid catalyst, the end product can be synthesized by first reacting an alkenyl ether with hydrochloric acid or the like to form a halogenated alkyl ether, and reacting it with a polymer under basic conditions in a conventional manner.

Illustrative, non-limiting, examples of the alkenyl ether include ethylene glycol divinyl ether, triethylene glycol divinyl ether, 1,2-propanediol divinyl ether, 1,3-propanediol divinyl ether, 1,3-butanediol divinyl ether, 1,4-butanediol divinyl ether, tetramethylene glycol divinyl ether, neopentyl glycol divinyl ether, trimethylolpropane trivinyl ether, trimethylolethane trivinyl ether, hexanediol divinyl ether, 1,4-cyclohexanediol divinyl ether, 1,4-divinyloxymethylcyclohexane, tetraethylene glycol divinyl ether, pentaerythritol divinyl ether, pentaerythritol trivinyl ether, pentaerythritol tetravinyl ether, sorbitol tetravinyl ether, sorbitol pentavinyl ether, ethylene glycol diethylene vinyl ether, triethylene glycol diethylene vinyl ether, ethylene glycol dipropylene vinyl ether, triethylene glycol diethylene vinyl ether, trimethylolpropane triethylene vinyl ether, trimethylolpropane diethylene vinyl ether, pentaerythritol diethylene vinyl ether, pantaerythritol triethylene vinyl ether, pentaerythritol tetraethylene vinyl ether, and the compounds of the following formulae (I-1) through (I-31).

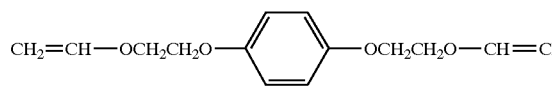
(I-1)

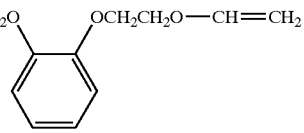
(I-2)

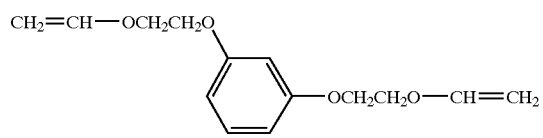
(I-3)

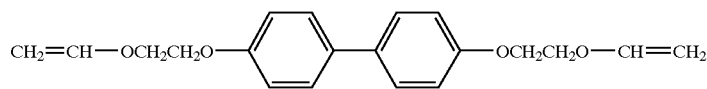
(I-4)

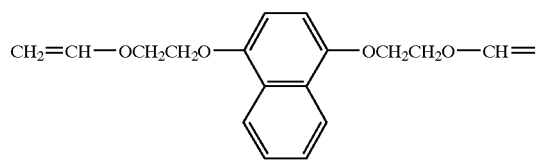
(I-5)

(I-6)

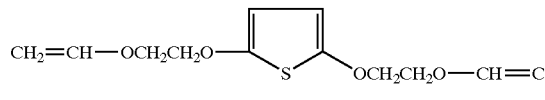
(I-7)

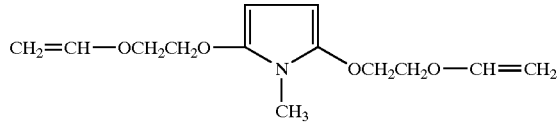
(I-8)

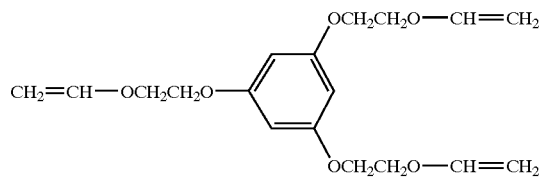
(I-9)

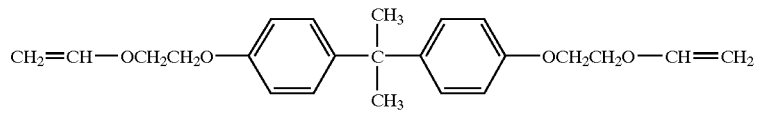
(I-10)

-continued
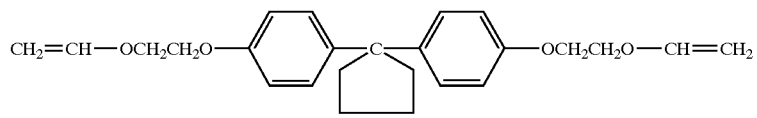
(I-11)
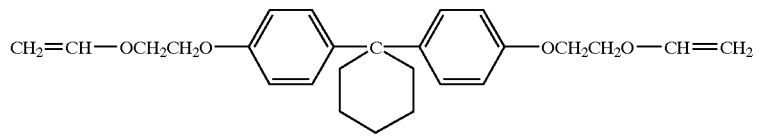
(I-12)
(I-13)
(I-14)
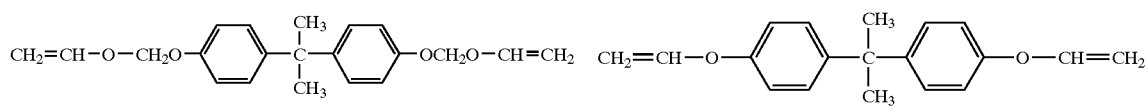
(I-15)
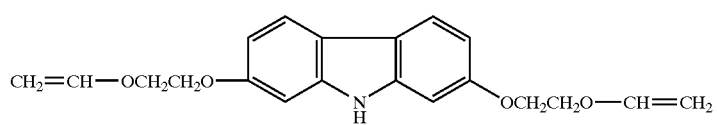
(I-16)
(I-17)
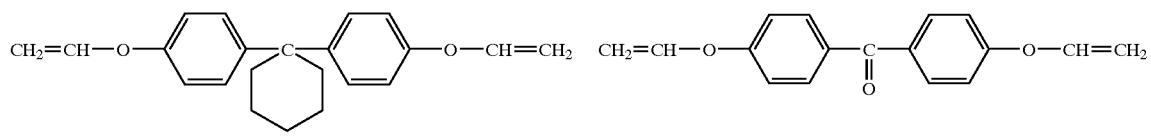
(I-18)
(I-19)
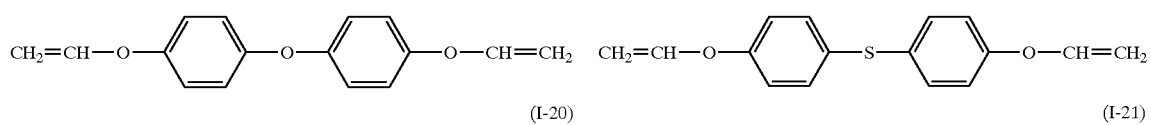
(I-20)
(I-21)
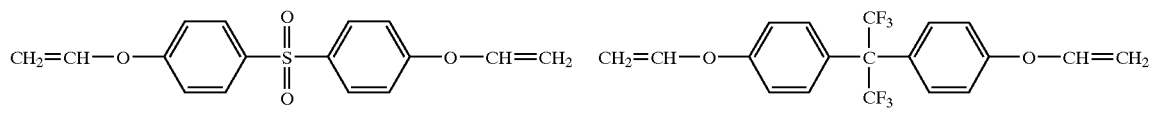
(I-22)
(I-23)
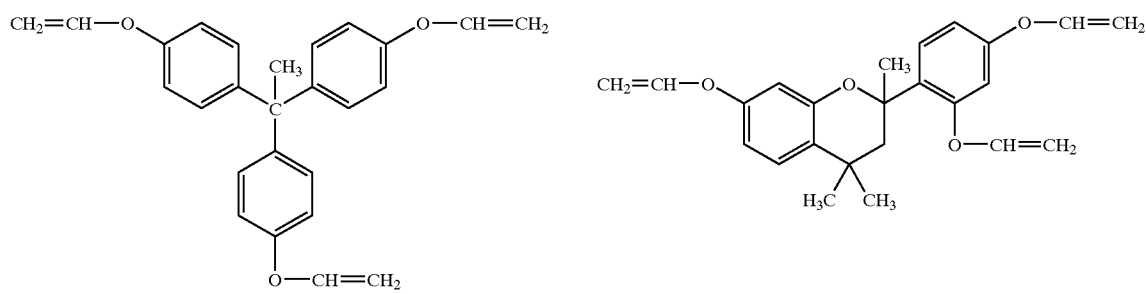
(I-24)
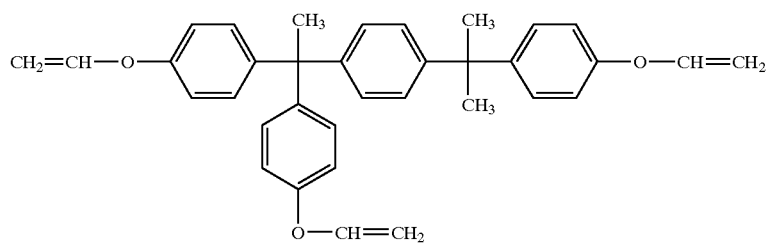

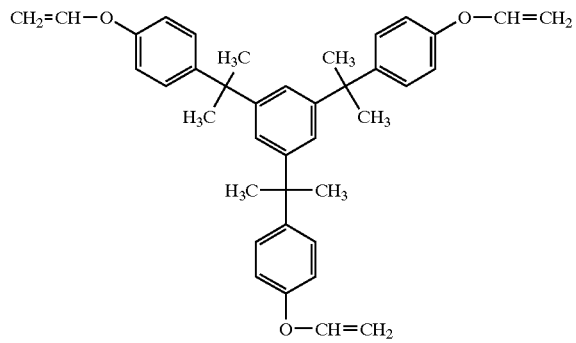
(I-25)

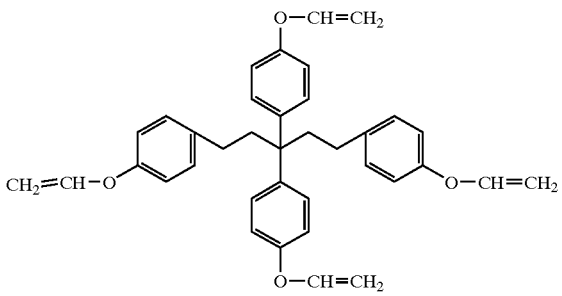
(I-26)

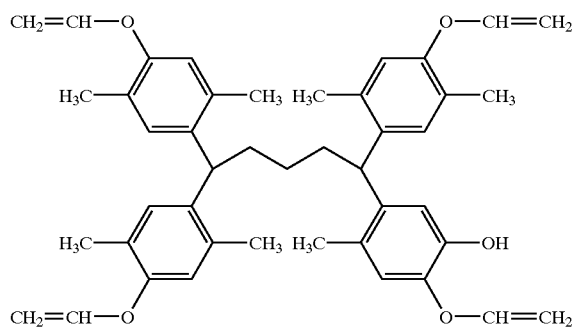
(I-27)

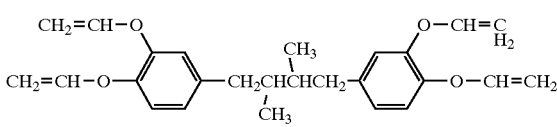
(I-28)

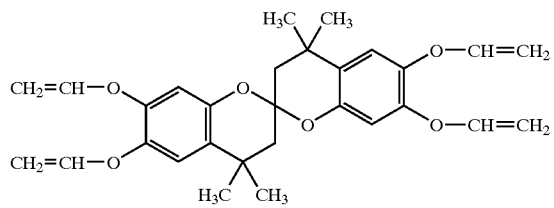
(I-29)

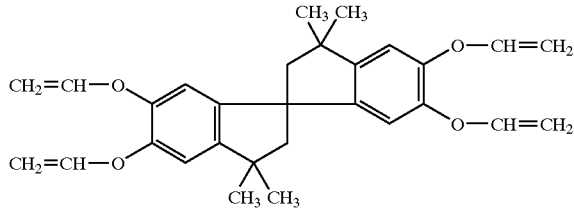
(I-30)

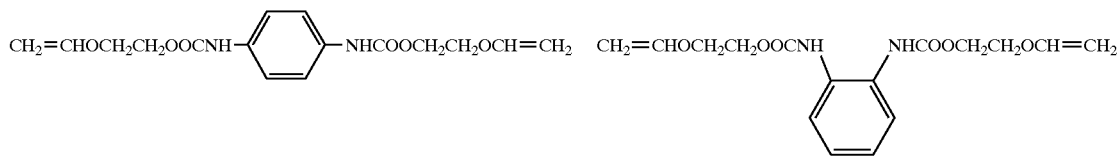
(I-31)

Also useful are terephthalic acid diethylene vinyl ether, phthalic acid diethylene vinyl ether, isophthalic acid diethylene vinyl ether, phthalic acid dipropylene vinyl ether, terephthalic acid dipropylene vinyl ether, isophthalic acid dipropylene vinyl ether, maleic acid diethylene vinyl ether, fumaric acid diethylene vinyl ether, itaconic acid diethylene vinyl ether as well as the compounds of the following formulae (II-1) through (II-11). Useful alkenyl ethers are not limited to these examples.

-continued

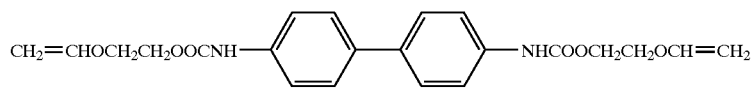
(II-3)

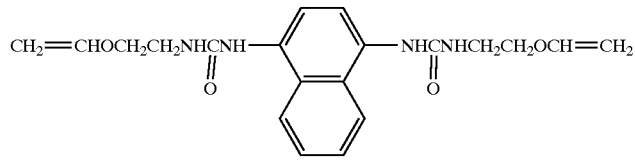
(II-4)

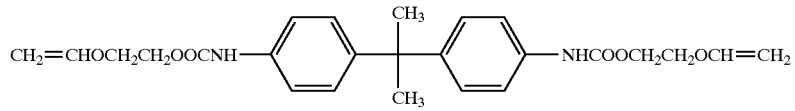
(II-5)

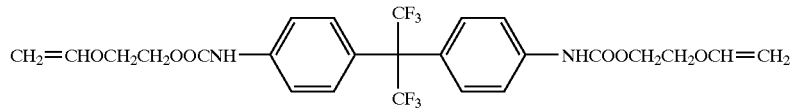
(II-6)

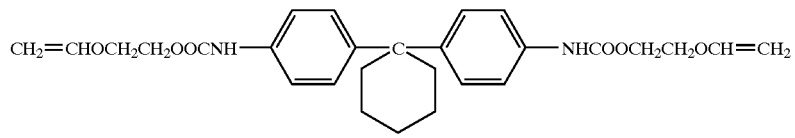
(II-7)

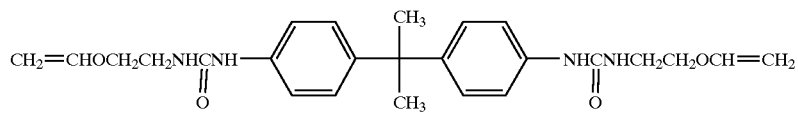
(II-8)

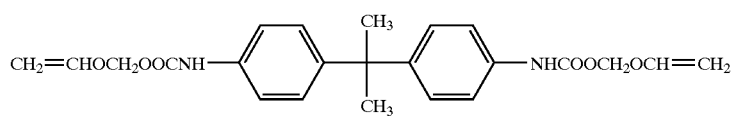
(II-9)

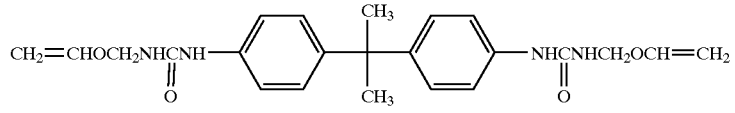
(II-10)

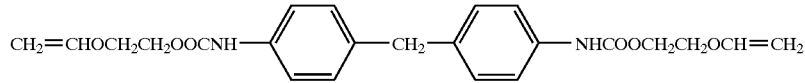
(II-11)

In the resist composition according to the invention, the resin used as component (B) is as described above. When the resin has acid labile groups other than formula (1), the preferred acid labile groups are 1-ethylcyclopentyl, 1-ethylcyclohexyloxycarbonylmethyl, tert-amyl, 1-ethoxyethyl, 1-ethoxypropyl, tetrahydrofuranyl, tetrahydropyranyl, tert-butyl, 1-ethylcyclohexyl, tert-butoxycarbonyl, tert-butoxy-carbonylmethyl groups, and substituents of formula (3a) wherein $R^7$ is methyl, $R^8$ is hydrogen, b is equal to 0, and A is ethylene, 1,4-butylene or 1,4-cyclohexylene.

In a single polymer, these substituents may be incorporated alone or in admixture of two or more types. A blend of two or more polymers having substituents of different types is also acceptable.

The percent proportion of these substituents substituting for phenol and carboxyl groups in the polymer is not critical. Preferably the percent substitution is selected such that when a resist composition comprising the polymer is applied onto a substrate to form a coating, the unexposed area of the coating may have a dissolution rate of 0.01 to 10 Å/sec in a 2.38% tetramethylammonium hydroxide (TMAH) developer.

On use of a polymer containing a greater proportion of carboxyl groups which can reduce the alkali dissolution rate, the percent substitution must be increased or non-acid-labile substituents to be described later must be introduced.

When acid labile groups for intramolecular and/or intermolecular crosslinking are to be introduced, the percent proportion of crosslinking substituents is preferably up to 20%, more preferably up to 10%. If the percent substitution of crosslinking substituents is too high, crosslinking results in a higher molecular weight which can adversely affect dissolution, stability and resolution. It is also preferred to further introduce another non-crosslinking acid labile group into the crosslinked polymer at a percent substitution of up to 10% for adjusting the dissolution rate to fall within the above range.

In the case of poly(p-hydroxystyrene), the optimum percent substitution differs between a substituent having a strong dissolution inhibitory action such as a tert-butoxycarbonyl group and a substituent having a weak dissolution inhibitory action such as an acetal group although the overall percent substitution is preferably 10 to 40%, more preferably 20 to 30%.

Polymers having such acid labile groups introduced therein should preferably have a weight average molecular weight (Mw) of about 3,000 to about 100,000. With a Mw of less than 3,000, polymers would perform poorly and often lack heat resistance and film formability. Polymers with a Mw of more than 100,000 would be less soluble in a developer and a resist solvent.

Where non-crosslinking acid labile groups are introduced, the polymer should preferably have a dispersity (Mw/Mn) of up to 3.5, preferably up to 1.5. A polymer with a dispersity of more than 3.5 often results in a low resolution. Where crosslinking acid labile groups are introduced, the starting alkali-soluble resin should preferably have a dispersity (Mw/Mn) of up to 1.5, and the dispersity is kept at 3 or lower even after protection with crosslinking acid labile groups. If the dispersity is higher than 3, dissolution, coating, storage stability and/or resolution is often poor.

To impart a certain function, suitable substituent groups may be introduced into some of the phenolic hydroxyl and carboxyl groups on the acid labile group-protected polymer. Exemplary are substituent groups for improving adhesion to the substrate, non-acid-labile groups for adjusting dissolution in an alkali developer, and substituent groups for improving etching resistance. Illustrative, non-limiting, substituent groups include 2-hydroxyethyl, 2-hydroxypropyl, methoxymethyl, methoxycarbonyl, ethoxycarbonyl, methoxycarbonylmethyl, ethoxycarbonylmethyl, 4-methyl-2-oxo-4-oxoranyl, 4-methyl-2-oxo-4-oxanyl, methyl, ethyl, propyl, n-butyl, sec-butyl, acetyl, pivaloyl, adamantyl, isobornyl, and cyclohexyl.

Photoacid Generator (A)

The photoacid generator (A) is a compound capable of generating an acid upon exposure to high energy radiation. Preferred photoacid generators are sulfonium salts, iodonium salts, sulfonyldiazomethanes, and N-sulfonyloxyimides. These photoacid generators are illustrated below while they may be used alone or in admixture of two or more.

Sulfonium salts are salts of sulfonium cations with sulfonates. Exemplary sulfonium cations include triphenylsulfonium, (4-tert-butoxyphenyl)diphenylsulfonium, bis(4-tert-butoxyphenyl)phenylsulfonium, tris(4-tert-butoxyphenyl)sulfonium, (3-tert-butoxyphenyl)diphenylsulfonium, bis(3-tert-butoxyphenyl)phenylsulfonium, tris(3-tert-butoxyphenyl)sulfonium, (3,4-di-tert-butoxyphenyl)diphenylsulfonium, bis(3,4-di-tert-butoxyphenyl)phenylsulfonium, tris(3,4-di-tert-butoxyphenyl)sulfonium, diphenyl(4-thiophenoxyphenyl)sulfonium, (4-tert-butoxycarbonylmethyloxyphenyl)diphenylsulfonium, tris(4-tert-butoxycarbonylmethyloxyphenyl)sulfonium, (4-tert-butoxyphenyl)bis(4-dimethylaminophenyl)sulfonium, tris(4-dimethylaminophenyl)sulfonium, 2-naphthyldiphenylsulfonium, dimethyl-2-naphthylsulfonium, 4-hydroxyphenyldimethylsulfonium, 4-methoxyphenyldimethylsulfonium, trimethylsulfonium, 2-oxocyclohexylcyclohexylmethylsulfonium, trinaphthylsulfonium, and tribenzylsulfonium. Exemplary sulfonates include trifluoromethanesulfonate, nonafluorobutanesulfonate, heptadecafluorooctanesulfonate, 2,2,2-trifluoroethanesulfonate, pentafluorobenzenesulfonate, 4-trifluoromethylbenzenesulfonate, 4-fluorobenzenesulfonate, toluenesulfonate, benzenesulfonate, 4,4-toluenesulfonyloxybenzenesulfonate, naphthalenesulfonate, camphorsulfonate, octanesulfonate, dodecylbenzenesulfonate, butanesulfonate, and methanesulfonate. Sulfonium salts based on combination of the foregoing examples are included.

Iodinium salts are salts of iodonium cations with sulfonates. Exemplary iodinium cations are aryliodonium cations including diphenyliodinium, bis(4-tert-butylphenyl)iodonium, 4-tert-butoxyphenylphenyliodonium, and 4-methoxyphenylphenyliodonium. Exemplary sulfonates include trifluoromethanesulfonate, nonafluorobutanesulfonate, heptadecafluorooctanesulfonate, 2,2,2-trifluoroethanesulfonate, pentafluorobenzenesulfonate, 4-trifluoromethylbenzenesulfonate, 4-fluorobenzenesulfonate, toluenesulfonate, benzenesulfonate, 4,4-toluenesulfonyloxybenzenesulfonate, naphthalenesulfonate, camphorsulfonate, octanesulfonate, dodecylbenzenesulfonate, butanesulfonate, and methanesulfonate. Iodonium salts based on combination of the foregoing examples are included.

Preferred sulfonium salts are triphenylsulfonium 10-camphorsulfonate, triphenylsulfonium nonafluorobutanesulfonate, triphenylsulfonium 4-(4-toluenesulfonyloxy)benzenesulfonate, triphenylsulfonium 2-trifluoromethylbenzenesulfonate, 4-tert-butoxyphenyldiphenylsulfonium 4-toluenesulfonate, 4-tert-butoxyphenyldiphenylsulfonium 10-camphorsulfonate, 4-tert-butoxyphenyldiphenylsulfonium pentafluorobenzenesulfonate, 4-tert-butylphenyldiphenylsulfonium nonafluorobutanesulfonate, 4-tert-butylphenyldiphenylsulfonium 4-toluenesulfonate, diphenyl-4-methylphenylsulfonium 4-(4-toluenesulfonyloxy)benzenesulfonate, tris(4-tert-butylphenyl)sulfonium 10-camphorsulfonate, tris(4-tert-butylphenyl)sulfonium pentafluorobenzenesulfonate, tris(4-methylphenyl)sulfonium nonafluorobutanesulfonate, tris(4-methylphenyl)sulfonium heptadecaoctanesulfonate, and diphenylmethylsulfonium nonafluorobutanesulfonate, though not limited thereto. Preferred iodonium salts are bis(4-tert-butylphenyl)iodonium 10-camphorsulfonate, bis(4-tert-butylphenyl)iodonium nonafluorobutanesulfonate, bis(4-tert-butylphenyl)iodonium pentafluorobenzenesulfonate, and bis(4-tert-butylphenyl)iodonium 4-(4-toluenesulfonyloxy)benzenesulfonate, though not limited thereto.

Exemplary sulfonyldiazomethane compounds include bissulfonyldiazomethane compounds and sulfonylcarbonyldiazomethane compounds such as bis(ethylsulfonyl)diazomethane, bis(1-methylpropylsulfonyl)diazomethane, bis(2-methylpropylsulfonyl)diazomethane, bis(1,1-dimethylethylsulfonyl)diazomethane, bis(cyclohexylsulfonyl)diazomethane, bis(perfluoroisopropylsulfonyl)diazomethane, bis(phenylsulfonyl)diazomethane, bis(4-methylphenylsulfonyl)diazomethane, bis(2,4-dimethylphenylsulfonyl)diazomethane, bis(2-naphthylsulfonyl)diazomethane, 4-methylphenylsulfonylbenzoyldiazomethaner tertbutylcarbonyl-4-methylphenylsulfonyldiazomethane, 2-naphthylsulfonylbenzoyldiazomethane, 4-methylphenylsulfonyl-2-naphthoyldiazomethane, methylsulfonylbenzoyldiazomethane, and tert-butoxycarbonyl-4-methylphenylsulfonyldiazomethane.

N-sulfonyloxyimide photoacid generators include combinations of imide skeletons with sulfonates. Exemplary imide skeletons are succinimide, naphthalene dicarboxylic acid imide, phthalimide, cyclohexyldicarboxylic acid imide, 5-norbornene-2,3-dicarboxylic acid imide, and 7-oxabicyclo[2.2.1]-5-heptene-2,3-dicarboxylic acid imide. Exemplary sulfonates include trifluoromethanesulfonate, nonafluorobutanesulfonate, heptadecafluorooctanesulfonate, 2,2,2-trifluoroethanesulfonate, pentafluorobenzenesulfonate, 4-trifluoromethylbenzenesulfonate, 4-fluorobenzenesulfonate, toluenesulfonate, benzenesulfonate, naphthalenesulfonate, camphorsulfonate, octanesulfonate, dodecylbenzenesulfonate, butanesulfonate, and methanesulfonate.

Benzoinsulfonate photoacid generators include benzoin tosylate, benzoin mesylate, and benzoin butanesulfonate.

Pyrogallol trisulfonate type photoacid generators include pyrogallol, phloroglucinol, catechol, resorcinol, hydroquinone, in which all the hydroxyl groups are replaced by trifluoromethanesulfonate, nonafluorobutanesulfonate, heptadecafluorooctanesulfonate, 2,2,2-trifluoroethanesulfonate, pentafluorobenzenesulfonate, 4-trifluoromethylbenzenesulfonate, 4-fluorobenzenesulfonate, toluenesulfonate, benzenesulfonate, naphthalenesulfonate, camphorsulfonate, octanesulfonate, dodecylbenzenesulfonate, butanesulfonate, and methanesulfonate.

Nitrobenzyl sulfonate photoacid generators include 2,4-dinitrobenzyl sulfonate, 2-nitrobenzyl sulfonate, and 2,6-dinitrobenzyl sulfonate, with exemplary sulfonates including trifluoromethanesulfonate, nonafluorobutanesulfonate, heptadecafluorooctanesulfonate, 2,2,2-trifluoroethanesulfonate, pentafluorobenzenesulfonate, 4-trifluoromethylbenzenesulfonate, 4-fluorobenzenesulfonate, toluenesulfonate, benzenesulfonate, naphthalenesulfonate, camphorsulfonate, octanesulfonate, dodecylbenzenesulfonate, butanesulfonate, and methanesulfonate. Also useful are analogous nitrobenzyl sulfonate compounds in which the nitro group on the benzyl side is replaced by a trifluoromethyl group.

Sulfone photoacid generators include bis(phenylsulfonyl)methane, bis(4-methylphenylsulfonyl)methane, bis(2-naphthylsulfonyl)methane, 2,2-bis(phenylsulfonyl)propane, 2,2-bis(4-methylphenylsulfonyl)propane, 2,2-bis(2-naphthylsulfonyl)propane, 2-methyl-2-(p-toluenesulfonyl)propiophenone, 2-cyclohexylcarbonyl-2-(p-toluenesulfonyl)propane, and 2,4-dimethyl-2-(p-toluenesulfonyl)pentan-3-one.

Photoacid generators in the form of glyoxime derivatives include bis-o-(p-toluenesulfonyl)-α-dimethylglyoxime, bis-o-(p-toluenesulfonyl)-α-diphenylglyoxime, bis-o-(p-toluenesulfonyl)-α-dicyclohexylglyoxime, bis-o-(p-toluenesulfonyl)-2,3-pentanedioneglyoxime, bis-o-(p-toluenesulfonyl)-2-methyl-3,4-pentanedioneglyoxime, bis-o-(n-butanesulfonyl)-α-dimethylglyoxime, bis-o-(n-butanesulfonyl)-α-diphenylglyoxime, bis-o-(n-butanesulfonyl)-α-dicyclohexylglyoxime, bis-o-(n-butanesulfonyl)-2,3-pentanedioneglyoxime, bis-o-(n-butanesulfonyl)-2-methyl-3,4-pentanedioneglyoxime, bis-o-(methanesulfonyl)-α-dimethylglyoxime, bis-o-(trifluoromethanesulfonyl)-α-dimethylglyoxime, bis-o-(1,1,1-trifluoroethanesulfonyl)-α-dimethylglyoxime, bis-o-(tert-butanesulfonyl)-α-dimethylglyoxime, bis-o-(perfluorooctanesulfonyl)-α-dimethylglyoxime, bis-o-(cyclohexylsulfonyl)-α-dimethylglyoxime, bis-o-(benzenesulfonyl)-α-dimethylglyoxime, bis-o-(p-fluorobenzenesulfonyl)-α-dimethylglyoxime, bis-o-(p-tert-butylbenzenesulfonyl)-α-dimethylglyoxime, bis-o-(xylenesulfonyl)-α-dimethylglyoxime, and bis-o-(camphorsulfonyl)-α-dimethylglyoxime.

Of these photoacid generators, the sulfonium salts, bis-sulfonyldiazomethane compounds, and N-sulfonyloxyimide compounds are preferred.

While the anion of the optimum acid to be generated differs depending on the ease of scission of acid labile groups introduced in the polymer, an anion which is non-volatile and not extremely diffusive is generally chosen. The preferred anions include benzenesulfonic acid anions, toluenesulfonic acid anions, 4,4-toluenesulfonyloxybenzenesulfonic acid anions, pentafluorobenzenesulfonic acid anions, 2,2,2-trifluoroethanesulfonic acid anions, nonafluorobutanesulfonic acid anions, heptadecafluorooctanesulfonic acid anions, and camphorsulfonic acid anions.

In the chemically amplified positive resist composition, an appropriate amount of the photoacid generator (A) is from more than 0 part to 20 parts, and especially 1 to 10 parts by weight per 100 parts by weight of the base resin in the composition. The photoacid generators may be used alone or in admixture of two or more. The transmittance of the resist film can be controlled by using a photoacid generator having a low transmittance at the exposure wavelength and adjusting the amount of the photoacid generator added.

Resist Composition

As defined above, the chemical amplification, positive resist composition of the invention is comprised of (A) the photoacid generator and (B) the resin which changes its solubility in an alkali developer under the action of acid and has substituents of formula (1). Illustrative embodiments of the invention are given below although the invention is not limited thereto.

Embodiment 1 is a chemical amplification, positive resist composition comprising (A) the photoacid generator, (B) the resin which changes its solubility in an alkali developer under the action of acid and has substituents of formula (1), and (G) an organic solvent.

Embodiment 2 is a chemical amplification, positive resist composition as set forth as Embodiment 1 and further comprising (C) a resin which changes its solubility in an alkali developer under the action of acid and is free of substituents of formula (1).

Embodiment 3 is a chemical amplification, positive resist composition as set forth as Embodiment 1 or 2 and further comprising (D) a basic compound.

Embodiment 4 is a chemical amplification, positive resist composition as set forth as Embodiment 1, 2 or 3 and further comprising (E) an organic acid derivative.

Embodiment 5 is a chemical amplification, positive resist composition as set forth as Embodiment 1, 2, 3 or 4 and further comprising (F) a compound with a molecular weight of up to 3,000 which changes its solubility in an alkali developer under the action of acid.

The respective components are described below.

Component (G)

Component (G) is an organic solvent. Illustrative, non-limiting, examples include butyl acetate, amyl acetate, cyclohexyl acetate, 3-methoxybutyl acetate, methyl ethyl ketone, methyl amyl ketone, cyclohexanone, cyclopentanone, 3-ethoxyethyl propionate, 3-ethoxymethyl propionate, 3-methoxymethyl propionate, methyl acetoacetate, ethyl acetoacetate, diacetone alcohol, methyl pyruvate, ethyl pyruvate, propylene glycol monomethyl ether, propylene glycol monoethyl ether, propylene glycol monomethyl ether propionate, propylene glycol monoethyl ether propionate, ethylene glycol monomethyl ether, ethylene glycol monoethyl ether, diethylene glycol monomethyl ether, diethylene glycol monoethyl ether, 3-methyl-3-methoxybutanol, N-methylpyrrolidone, dimethyl sulfoxide, γ-butyrolactone, propylene glycol methyl ether acetate, propylene glycol ethyl ether acetate, propylene glycol propyl ether acetate, methyl lactate, ethyl lactate, propyl lactate, and tetramethylene sulfone. Of these, the propylene glycol alkyl ether acetates and alkyl lactates are especially preferred. The solvents may be used alone or in admixture of two or more. An exemplary useful solvent mixture is a mixture of a propylene glycol alkyl ether acetate and an alkyl lactate. It is noted that the alkyl groups of the propylene glycol alkyl ether acetates are preferably those of 1 to 4 carbon atoms, for example, methyl, ethyl and propyl, with methyl and ethyl being especially preferred. Since the propylene glycol alkyl ether acetates include 1,2- and 1,3-substituted ones, each includes three isomers depending on the combination of substituted positions, which may be used alone or in admixture. It is also noted that the alkyl groups of the alkyl lactates are preferably those of 1 to 4 carbon atoms, for example, methyl, ethyl and propyl, with methyl and ethyl being especially preferred.

When the propylene glycol alkyl ether acetate is used as the solvent, it preferably accounts for at least 50% by weight of the entire solvent. Also when the alkyl lactate is used as the solvent, it preferably accounts for at least 50% by weight of the entire solvent. When a mixture of propylene glycol alkyl ether acetate and alkyl lactate is used as the solvent, this mixture preferably accounts for at least 50% by weight of the entire solvent. In this solvent mixture, it is further preferred that the propylene glycol alkyl ether acetate is 60 to 95% by weight and the alkyl lactate is 40 to 5% by weight. A lower proportion of the propylene glycol alkyl ether acetate would invite a problem of inefficient coating whereas a higher proportion thereof would provide insufficient dissolution and allow for particle and particle formation. A lower proportion of the alkyl lactate would provide insufficient dissolution and cause the problem of many particles and particle whereas a higher proportion thereof would lead to a composition which has a too high viscosity to apply and loses storage stability.

Usually the solvent is used in amounts of about 300 to 2,000 parts, preferably about 400 to 1,000 parts by weight per 100 parts by weight of the base resin in the chemically amplified positive resist composition. The concentration is not limited to this range as long as film formation by existing methods is possible.

Other Resin (C)

A resin which changes its solubility in an alkali developer under the action of acid and is free of substituents of formula (1) may be added as component (C) to the chemically amplified positive resist composition in addition to the resin (B) which changes its solubility in an alkali developer under the action of acid and has substituents of formula (1).

Though not critical, the resin (C) which changes its solubility in an alkali developer under the action of acid and is free of substituents of formula (1) is preferably selected from those alkali-soluble resins as described previously in connection with component (B) having introduced therein acid labile groups as described above in connection with component (B), for example, groups of the above formulas (4) to (7), tertiary alkyl groups with 4 to 20 carbon atoms, preferably with 4 to 15 carbon atoms, trialkylsilyl groups whose alkyl groups each have 1 to 6 carbon atoms, and oxoalkyl groups of 4 to 20 carbon atoms.

Preferred are resins in the form of poly(p-hydroxystyrene) and p-hydroxystyrene/(meth)acrylic acid copolymers in which some of the hydrogen atoms on phenolic hydroxyl groups and/or carboxyl groups are replaced by acid labile groups of one or more types.

Illustrative preferred acid labile groups are 1-akoxyalkyl, tert-alkyloxycarbonyl, tert-alkyl, 2-tetrahydropyranyl and 2-tetrahydrofuranyl groups.

Preferred combinations of two or more types of acid labile groups are combinations of different acetal groups, combinations of groups differing in ease of cleavage under the action of acid, such as acetal with tert-butoxy, combinations of a crosslinking acid labile group with acetal, and combinations of a crosslinking acid labile group with a group differing in ease of cleavage under the action of acid, such as tert-butoxy.

The proportion of the resin (B) which changes its solubility in an alkali developer under the action of acid and has substituents of formula (1) to the resin (C) which changes its solubility in an alkali developer under the action of acid and is free of substituents of formula (1) is not critical. When the resin (C) is added, it is recommended that the content of the resin (C) is 0 to 99% by weight, especially 1 to 50% by weight based on the resins (B) and (C) combined.

Basic Compound (D)

The basic compound (D) is preferably a compound capable of suppressing the rate of diffusion when the acid generated by the photoacid generator diffuses within the resist film. The inclusion of this type of basic compound holds down the rate of acid diffusion within the resist film, resulting in better resolution. In addition, it suppresses changes in sensitivity following exposure and reduces substrate and environment dependence, as well as improving the exposure latitude and the pattern profile.

Examples of basic compounds include primary, secondary, and tertiary aliphatic amines, mixed amines, aromatic amines, heterocyclic amines, carboxyl group-bearing nitrogenous compounds, sulfonyl group-bearing nitrogenous compounds, hydroxyl group-bearing nitrogenous compounds, hydroxyphenyl group-bearing nitrogenous compounds, alcoholic nitrogenous compounds, amide derivatives, and imide derivatives.

Examples of suitable primary aliphatic amines include ammonia, methylamine, ethylamine, n-propylamine, isopropylamine, n-butylamine, isobutylamine, sec-butylamine, tert-butylamine, pentylamine, tert-amylamine, cyclopentylamine, hexylamine, cyclohexylamine, heptylamine, octylamine, nonylamine, decylamine, dodecylamine, cetylamine, methylenediamine, ethylenediamine, and tetraethylenepentamine. Examples of suitable secondary aliphatic amines include dimethylamine, diethylamine, di-n-propylamine, diisopropylamine, di-n-butylamine, diisobutylamine, di-sec-butylamine, dipentylamine, dicyclopentylamine, dihexylamine, dicyclohexylamine, diheptylamine, dioctylamine, dinonylamine, didecylamine, didodecylamine, dicetylamine, N,N-dimethylmethylenediamine, N,N-dimethylethylenediamine, and N,N-dimethyltetraethylenepentamine. Examples of suitable tertiary aliphatic amines include trimethylamine, triethylamine, tri-n-propylamine, triisopropylamine, tri-n-butylamine, truisobutylamine, tri-sec-butylamine, tripentylamine, tricyclopentylamine, trihexylamine, tricyclohexylamine, triheptylamine, trioctylamine, trinonylamine, tridecylamine, tridodecylamine, tricetylamine, N,N,N',N'-tetramethylmethylenediamine, N,N,N',N'-tetramethylethylenediamine, and N,N,N',N'-tetramethyltetraethylenepentamine.

Examples of suitable mixed amines include dimethylethylamine, methylethylpropylamine, benzylamine, phenethylamine, and benzyldimethylamine. Examples of suitable aromatic and heterocyclic amines include aniline derivatives (e.g., aniline, N-methylaniline, N-ethylaniline, N-propylaniline, N,N-dimethylaniline, 2-methylaniline, 3-methylaniline, 4-methylaniline, ethylaniline, propylaniline, trimethylaniline, 2-nitroaniline, 3-nitroaniline, 4-nitroaniline, 2,4-dinitroaniline, 2,6-dinitroaniline, 3,5-dinitroaniline, and N,N-dimethyltoluidine), diphenyl(p-tolyl)amine, methyldiphenylamine, triphenylamine, phenylenediamine, naphthylamine, diaminonaphthalene, pyrrole derivatives (e.g., pyrrole, 2H-pyrrole, 1-methylpyrrole, 2,4-dimethylpyrrole, 2,5-dimethylpyrrole, and N-methylpyrrole), oxazole derivatives (e.g., oxazole and isooxazole), thiazole derivatives (e.g., thiazole and isothiazole), imidazole derivatives (e.g., imidazole, 4-methylimidazole, and 4-methyl-2-phenylimidazole), pyrazole derivatives, furazan derivatives, pyrroline derivatives (e.g., pyrroline and 2-methyl-1-pyrroline), pyrrolidine derivatives (e.g., pyrrolidine, N-methylpyrrolidine, pyrrolidinone, and N-methylpyrrolidone), imidazoline derivatives, imidazolidine derivatives, pyridine derivatives (e.g., pyridine, methylpyridine, ethylpyridine, propylpyridine, butylpyridine, 4-(1-butylpentyl)pyridine, dimethylpyridine, trimethylpyridine, triethylpyridine, phenylpyridine, 3-methyl-2-phenylpyridine, 4-tert-butylpyridine, diphenylpyridine, benzylpyridine, methoxypyridine, butoxypyridine, dimethoxypyridine, 1-methyl-2-pyridine, 4-pyrrolidinopyridine, 1-methyl-4-phenylpyridine, 2-(1-ethylpropyl)pyridine, aminopyridine, and dimethylaminopyridine), pyridazine derivatives, pyrimidine derivatives, pyrazine derivatives, pyrazoline derivatives, pyrazolidine derivatives, piperidine derivatives, piperazine derivatives, morpholine derivatives, indole derivatives, isoindole derivatives, 1H-indazole derivatives, indoline derivatives, quinoline derivatives (e.g., quinoline and 3-quinolinecarbonitrile), isoquinoline derivatives, cinnoline derivatives, quinazoline derivatives, quinoxaline derivatives, phthalazine derivatives, purine derivatives, pteridine derivatives, carbazole derivatives, phenanthridine derivatives, acridine derivatives, phenazine derivatives, 1,10-phenanthroline derivatives, adenine derivatives, adenosine derivatives, guanine derivatives, guanosine derivatives, uracil derivatives, and uridine derivatives.

Examples of suitable carboxyl group-bearing nitrogenous compounds include aminobenzoic acid, indolecarboxylic acid, and amino acid derivatives (e.g. nicotinic acid, alanine, alginine, aspartic acid, glutamic acid, glycine, histidine, isoleucine, glycylleucine, leucine, methionine, phenylalanine, threonine, lysine, 3-aminopyrazine-2-carboxylic acid, and methoxyalanine). Examples of suitable sulfonyl group-bearing nitrogenous compounds include 3-pyridinesulfonic acid and pyridinium p-toluenesulfonate. Examples of suitable hydroxyl group-bearing nitrogenous compounds, hydroxyphenyl group-bearing nitrogenous compounds, and alcoholic nitrogenous compounds include 2-hydroxypyridine, aminocresol, 2,4-quinolinediol, 3-indolemethanol hydrate, monoethanolamine, diethanolamine, triethanolamine, N-ethyldiethanolamine, N,N-diethylethanolamine, triisopropanolamine, 2,2'-iminodiethanol, 2-aminoethanol, 3-amino-1-propanol, 4-amino-1-butanol, 4-(2-hydroxyethyl)morpholine, 2-(2-hydroxyethyl)pyridine, 1-(2-hydroxyethyl)piperazine, 1-[2-(2-hydroxyethoxy)ethyl]-piperazine, piperidine ethanol, 1-(2-hydroxyethyl)pyrrolidine, 1-(2-hydroxyethyl)-2-pyrrolidinone, 3-piperidino-1,2-propanediol, 3-pyrrolidino-1,2-propanediol, 8-hydroxyjulolidine, 3-quinuclidinol, 3-tropanol, 1-methyl-2-pyrrolidine ethanol, 1-aziridine ethanol, N-(2-hydroxyethyl)phthalimide, and N-(2-hydroxyethyl)isonicotinamide. Examples of suitable amide derivatives include formamide, N-methylformamide, N,N-dimethylformamide, acetamide, N-methylacetamide, N,N-dimethylacetamide, propionamide, and benzamide. Suitable imide derivatives include phthalimide, succinimide, and maleimide.

Also useful are substituted ones of the hydroxyl group-bearing nitrogenous compounds in which some or all of the hydrogen atoms on hydroxyl groups are replaced by methyl, ethyl, methoxymethyl, methoxyethoxymethyl, acetyl, or ethoxyethyl groups. Preferred are methyl-, acetyl-, methoxymethyl- and methoxyethoxymethyl-substituted compounds of ethanolamine, diethanolamine and triethanolamine. Examples include tris(2-methoxyethyl)amine, tris (2-ethoxyethyl)amine, tris(2-acetoxyethyl)amine, tris{2-(methoxymethoxy)ethyl}amine, tris{2-(methoxyethoxy) ethyl}amine, tris[2-{(2-methoxyethoxy)methoxy}ethyl] amine, tris{2-(2-methoxyethoxy)ethyl}amine, tris{2-(1-methoxyethoxy)ethyl}amine, tris{2-(1-ethoxyethoxy) ethyl}amine, tris{2-(1-ethoxypropoxy)ethyl}amine, and tris [2-{(2-hydroxyethoxy)ethoxy}ethyl]amine.

The basic compounds may be used alone or in admixture of two or more. The basic compound is preferably formulated in an amount of 0 to 2 parts, and especially 0.01 to 1 part by weight, per 100 parts by weight of the base resin in the resist composition. The use of more than 2 parts of the basis compound would result in too low a sensitivity.

Organic Acid Derivative (E)

Illustrative, non-limiting, examples of the organic acid derivatives (E) include phenol, cresol, catechol, resorcinol, pyrogallol, phloroglucinol, bis(4-hydroxyphenyl)methane, 2,2-bis(4'-hydroxyphenyl)propane, bis(4-hydroxyphenyl) sulfone, 1,1,1-tris(4'-hydroxyphenyl)ethane, 1,1,2-tris(4'-hydroxyphenyl)ethane, hydroxybenzophenone, 4-hydroxyphenylacetic acid, 3-hydroxyphenylacetic acid, 2-hydroxyphenylacetic acid, 3-(4-hydroxyphenyl)propionic acid, 3-(2-hydroxyphenyl)propionic acid, 2,5-dihydroxyphenylacetic acid, 3,4-dihydroxyphenylacetic acid, 1,2-phenylenediacetic acid, 1,3-phenylenediacetic acid, 1,4-phenylenediacetic acid, 1,2-phenylenedioxydiacetic acid, 1,4-phenylenedipropanoic acid, benzoic acid, salicylic acid, 4,4-bis(4'-hydroxyphenyl) valeric acid, 4-tert-butoxyphenylacetic acid, 4-(4-hydroxyphenyl)butyric acid, 3,4-dihydroxymandelic acid, and 4-hydroxymandelic acid. Of these, salicylic acid and 4,4-bis(4'-hydroxyphenyl)valeric acid are preferred. They may be used alone or in admixture of two or more.

In the resist composition, the organic acid derivative is preferably formulated in an amount of up to 5 parts, and especially up to 1 part by weight, per 100 parts by weight of the base resin in the resist composition. The use of more than 5 parts of the organic acid derivative would result in too low a resolution. Depending on the combination of the other components in the resist composition, the organic acid derivative may be omitted.

Component (F)

In one preferred embodiment, the resist composition further contains (F) a compound with a molecular weight of up to 3,000 which changes its solubility in an alkaline developer under the action of an acid, that is, a dissolution inhibitor. Typically, a compound obtained by partially or entirely substituting acid labile substituents on a phenol or carboxylic acid derivative having a molecular weight of up to 2,500 is added as the dissolution inhibitor.

Examples of the phenol or carboxylic acid derivative having a molecular weight of up to 2,500 include bisphenol A, bisphenol H, bisphenol S, 4,4-bis(4'-hydroxyphenyl) valeric acid, tris(4-hydroxyphenyl)methane, 1,1,1-tris(4'-hydroxyphenyl)ethane, 1,1,2-tris(4'-hydroxyphenyl)ethane, phenolphthalein, and thimolphthalein. The acid labile substituents are the same as those exemplified as the acid labile groups in the polymer.

Illustrative, non-limiting, examples of the dissolution inhibitors which are useful herein include bis(4-(2'-tetrahydropyranyloxy)phenyl)methane, bis(4-(2'-tetrahydrofuranyloxy)phenyl)methane, bis(4-tert-butoxyphenyl)methane, bis(4-tert-butoxycarbonyloxyphenyl)methane, bis(4-tert-butoxycarbonylmethyloxyphenyl)methane, bis(4-(1'-ethoxyethoxy)phenyl)methane, bis(4-(1'-ethoxypropyloxy)phenyl)methane, 2,2-bis(4'-(2"-tetrahydropyranyloxy)) propane, 2,2-bis(4'-(2"-tetrahydrofuranyloxy)phenyl)propane, 2,2-bis(4'-tert-butoxyphenyl)propane, 2,2-bis(4'-tert-butoxycarbonyloxyphenyl)propane, 2,2-bis(4-tert-butoxycarbonylmethyloxyphenyl)propane, 2,2-bis(4'-(1"-ethoxyethoxy)phenyl)propane, 2,2-bis(4'-(1"-ethoxypropyloxy)phenyl)propane, tert-butyl 4,4-bis(4'-(2"-tetrahydropyranyloxy)phenyl)-valerate, tert-butyl 4,4-bis (4'-(2"-tetrahydrofuranyloxy)phenyl)-valerate, tert-butyl 4,4-bis(4'-tert-butoxyphenyl)valerate, tert-butyl 4,4-bis(4-tert-butoxycarbonyloxyphenyl)valerate, tert-butyl 4,4-bis (4'-tert-butoxycarbonylmethyloxyphenyl)-valerate, tert-butyl 4,4-bis(4'-(1"-ethoxyethoxy)phenyl)valerate, tert-butyl 4,4-bis(4'-(1"-ethoxypropyloxy)phenyl)valerate, tris (4-(2'-tetrahydropyranyloxy)phenyl)methane, tris(4-(2'-tetrahydrofuranyloxy)phenyl)methane, tris(4-tert-butoxyphenyl)methane, tris(4-tert-butoxycarbonyloxyphenyl)methane, tris(4-tert-butoxycarbonyloxymethylphenyl)methane, tris(4-(1'-ethoxyethoxy)phenyl)methane, tris(4-(1'-ethoxypropyloxy) phenyl)methane, 1,1,2-tris(4'-(2"-tetrahydropyranyloxy) phenyl)ethane, 1,1,2-tris(4'-(2"-tetrahydrofuranyloxy) phenyl)ethane, 1,1,2-tris(4'-tert-butoxyphenyl)ethane, 1,1,2-tris(4'-tert-butoxycarbonyloxyphenyl)ethane, 1,1,2-tris(4'-tert-butoxycarbonylmethyloxyphenyl)ethane, 1,1,2-tris(4'-(1'-ethoxyethoxy)phenyl)ethane, and 1,1,2-tris(4'-(1'-ethoxypropyloxy)phenyl)ethane.

In the resist composition, an appropriate amount of the dissolution inhibitor is up to 20 parts, and especially up to 15 parts by weight per 100 parts by weight of the base resin in the composition. With more than 20 parts of the dissolution inhibitor, the resist composition becomes less heat resistant because of an increased content of monomer components.

In the chemically amplified positive resist composition of the invention, there may be added an acid-propagating compound, a surfactant for improving coating characteristics, and a light absorber for reducing diffuse reflection from the substrate.

The acid-propagating compound is a compound which is decomposed with an acid to generate an acid. For these compounds, reference should be made to J. Photopolym. Sci. and Tech., 8, 43–44, 45–46 (1995), and ibid., 9, 29–30 (1996).

Examples of the acid-propagating compound include tert-butyl-2-methyl-2-tosyloxymethyl acetoacetate and 2-phenyl-2-(tosyloxyethyl)-1,3-dioxoran, but are not limited thereto. Of well-known photoacid generators, many of those compounds having poor stability, especially poor thermal stability exhibit an acid-propagating compound-like behavior.

In the resist composition, an appropriate amount of the acid-propagating compound is up to 2 parts, and especially up to 1 part by weight per 100 parts by weight of the base resin in the composition. Excessive amounts of the acid-propagating compound makes diffusion control difficult, leading to degradation of resolution and pattern configuration.

Illustrative, non-limiting, examples of the surfactant include nonionic surfactants, for example, polyoxyethylene alkyl ethers such as polyoxyethylene lauryl ether, polyoxyethylene stearyl ether, polyoxyethylene cetyl ether, and polyoxyethylene oleyl ether, polyoxyethylene alkylaryl ethers such as polyoxyethylene octylphenol ether and polyoxyethylene nonylphenol ether, polyoxyethylene polyoxypropylene block copolymers, sorbitan fatty acid esters such as sorbitan monolaurate, sorbitan monopalmitate, and sorbitan monostearate, and polyoxyethylene sorbitan fatty acid esters such as polyoxyethylene sorbitan monolaurate, polyoxyethylene sorbitan monopalmitate, polyoxyethylene sorbitan monostearate, polyoxyethylene sorbitan trioleate, and polyoxyethylene sorbitan tristearate; fluorochemical surfactants such as EFTOP EF301, EF303 and EF352 (Tohkem Products K.K.), Megaface F171, F172 and F173 (Dai-Nippon Ink & Chemicals K.K.), Florade FC430 and FC431 (Sumitomo 3M K.K.), Aashiguard AG710, Surflon S-381, S-382, SC101, SC102, SC103, SC104, SC105, SC106, Surfynol E1004, KH-10, KH-20, KH-30 and KH-40 (Asahi Glass K.K.); organosiloxane polymers KP341, X-70-092 and X-70-093 (Shin-Etsu Chemical Co., Ltd.), acrylic acid or methacrylic acid Polyflow No. 75 and No. 95 (Kyoeisha Ushi Kagaku Kogyo K.K.). Inter alia, FC430, Surflon S-381, Surfynol E1004, KH-20 and KH-30 are preferred. These surfactants may be used alone or in admixture.

In the resist composition, the surfactant is preferably formulated in an amount of up to 2 parts, and especially up to 1 part by weight, per 100 parts by weight of the base resin in the resist composition.

In the chemically amplified positive resist composition, a UV absorber may be added.

Exemplary UV absorbers are fused polycyclic hydrocarbon derivatives such as pentalene, indene, naphthalene, azulene, heptalene, biphenylene, indacene, fluorene, phenalene, phenanthrene, anthracene, fluoranthene, acephenanthrylene, aceanthrylene, triphenylene, pyrene, chrysene, pleiadene, picene, perylene, pentaphene, pentacene, benzophenanthrene, anthraquinone, anthrone, benzanthrone, 2,7-dimethoxynaphthalene, 2-ethyl-9,10-dimethoxyanthracene, 9,10-dimethylanthracene, 9-ethoxyanthracene, 1,2-naphthoquinone, 9-fluorene, and compounds of the following formulae (D1) and (D2); fused heterocyclic derivatives such as thioxanthen-9-one, thianthrene, dibenzothiophene; benzophenone derivatives such as 2,3,4-trihydroxybenzophenone, 2,3,4,4'-tetrahydroxybenzophenone, 2,4-dihydroxybenzophenone, 3,5-dihydroxybenzophenone, 4,4'-dihydroxybenzophenone, and 4,4'-bis(dimethylamino)benzophenone; squalic acid derivatives such as squalic acid and dimethyl squalate; diaryl sulfoxide derivatives such as bis(4-hydroxyphenyl) sulfoxide, bis(4-tert-butoxyphenyl) sulfoxide, bis(4-tert-butoxycarbonyloxyphenyl) sulfoxide, and bis[4-(1-ethoxyethoxy)phenyl] sulfoxide; diarylsulfone derivatives such as bis(4-hydroxyphenyl)sulfone, bis(4-tertbutoxyphenyl)sulfone, bis(4-tert-butoxycarbonyloxyphenyl)sulfone, bis[4-(1-ethoxyethoxy)phenyl]sulfone, and bis[4-(1-ethoxypropoxy)phenyl]sulfone; diazo compounds such as benzoquinonediazide, naphthoquinonediazide, anthraquinonediazide, diazofluorene, diazotetralone, and diazophenanthrone; quinonediazide group-containing compounds such as complete or partial ester compounds between naphthoquinone-1,2-diazide-5-sulfonic acid chloride and 2,3,4-trihydroxybenzophenone and complete or partial ester compounds between naphthoquinone-1,2-diazide-4-sulfonic acid chloride and 2,4,4'-trihydroxybenzophenone; tert-butyl 9-anthracenecarboxylate, tert-amyl 9-anthracenecarboxylate, tert-methoxymethyl 9-anthracenecarboxylate, tert-ethoxyethyl 9-anthracenecarboxylate, 2-tert-tetrahydropyranyl 9-anthracenecarboxylate, and 2-tert-tetrahydrofuranyl 9-anthracenecarboxylate.

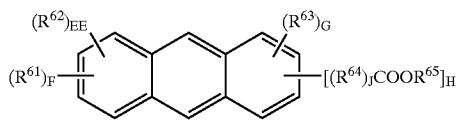
(D1)

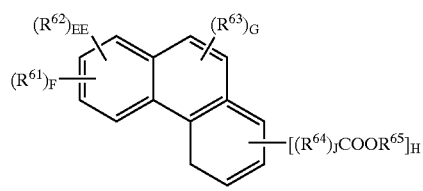
(D2)

Herein, $R^{61}$ to $R^{63}$ are independently hydrogen or a straight or branched alkyl, straight or branched alkoxy, straight or branched alkoxyalkyl, straight or branched alkenyl or aryl group. $R^{64}$ is a substituted or unsubstituted divalent aliphatic hydrocarbon group which may contain an oxygen atom, a substituted or unsubstituted divalent alicyclic hydrocarbon group which may contain an oxygen atom, a substituted or unsubstituted divalent aromatic hydrocarbon group which may contain an oxygen atom, or an oxygen atom. $R^{65}$ is an acid labile group as described above. Letter J is equal to 0 or 1, EE, F and G are 0 or integers of 1 to 9, H is a positive integer of 1 to 10, satisfying EE+F+G+H≦10.

An appropriate amount of UV absorber blended is 0 to 10 parts, more preferably 0.5 to 10 parts, most preferably 1 to 5 parts by weight per 100 parts by weight of the base resin in the resist composition.

For the microfabrication of integrated circuits, any well-known lithography may be used to form a resist pattern from the chemical amplification, positive working, resist composition comprising (A) the photoacid generator and (B) the resin which changes its solubility in an alkali developer under the action of acid and has substituents of formula (1) according to the invention.

The composition is applied onto a substrate (e.g., Si, $SiO_2$, SiN, SiON, TiN, WSi, BPSG, SOG, organic anti-reflecting film, etc.) by a suitable coating technique such as spin coating, roll coating, flow coating, dip coating, spray coating or doctor coating. The coating is prebaked on a hot plate at a temperature of 60 to 150° C. for about 1 to 10 minutes, preferably 80 to 120° C. for 1 to 5 minutes. The resulting resist film is generally 0.1 to 2.0 μm thick. With a mask having a desired pattern placed above the resist film, the resist film is then exposed to actinic radiation, preferably having an exposure wavelength of up to 300 nm, such as UV, deep-UV, electron beams, x-rays, excimer laser light, γ-rays and synchrotron radiation in an exposure dose of about 1 to 200 mJ/cm$^2$, preferably about 10 to 100 mJ/cm$^2$. The film is further baked on a hot plate at 60 to 150° C. for 1 to 5 minutes, preferably 80 to 120° C. for 1 to 3 minutes (post-exposure baking=PEB).

Thereafter the resist film is developed with a developer in the form of an aqueous base solution, for example, 0.1 to 5%, preferably 2 to 3% aqueous solution of tetramethylammonium hydroxide (TMAH) for 0.1 to 3 minutes, preferably 0.5 to 2 minutes by conventional techniques such as dipping, puddling or spraying. In this way, a desired resist pattern is formed on the substrate. It is appreciated that the resist composition of the invention is best suited for micropatterning using such actinic radiation as deep UV with a wavelength of 254 to 193 nm, vacuum UV with a wavelength of 157 nm, electron beams, x-rays, excimer laser light, γ-rays and synchrotron radiation. With any of the above-described parameters outside the above-described range, the process may sometimes fail to produce the desired pattern.

EXAMPLE

Examples of the invention are given below by way of illustration and not by way of limitation.

Synthesis Example 1

Synthesis of Allyl Cyclohexyl Ether

In 870 g of tetrahydrofuran were dissolved 200 g (2 mol) of cyclohexanol and 224 g (2 mol) of potassium t-butoxide. With stirring at room temperature, 242 g (2 mol) of allyl bromide was added dropwise so that the temperature might not exceed 60° C. At the end of addition, the solution was heated at 60° C. on an oil bath and ripened for one hour at the temperature. The solution was allowed to cool down to room temperature, and 11.2 g (0.1 mol) of t-butoxypotassium was added. With stirring at room temperature, 12.1 g (0.1 mol) of allyl bromide was added dropwise. The solution was heated at 60° C. on an oil bath and ripened for one hour at the temperature. The solution was cooled in an ice bath, and 550 g of water was added. The organic layer was collected. The solvent was distilled off in vacuum, yielding 280 g of a crude end product. The product was used in the subsequent reaction without further purification.

Synthesis Example 2

Synthesis of Cyclohexyl Propenyl Ether

A mixture of 280 g of the crude product, 300 g of dimethyl sulfoxide, and 22.5 g (0.2 mol) of potassium t-butoxide was heated at 100° C. on the oil bath and ripened for 2 hours at the temperature. The solution was allowed to cool, and 650 g of water and 600 g of n-hexane were added thereto, from which the organic layer was collected. The organic layer was washed with 250 g of water, and the solvent was distilled off in vacuum, leaving 300 g of an oily substance. The oily substance was subjected to vacuum distillation, obtaining 240 g of the end product, cyclohexyl propenyl ether. The yield was 86% (two steps) and the purity was 99.0% as analyzed by gas chromatography.

The results of nuclear magnetic resonance spectroscopy, infrared absorption spectroscopy and elemental analysis of the compound are shown below.

$^1$H-NMR: CDCl$_3$ (PPm)

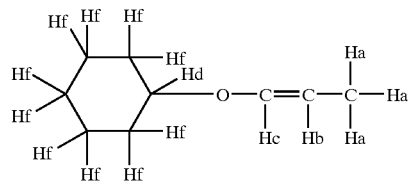

Ha: 1.57–1.60 multiplet 3H Hb: 4.33–6.00 multiplet 1H Hc: 5.96–6.00 multiplet 1H Hd: 3.53–3.61 multiplet 1H Hf: 1.20–1.88 multiplet 10H IR: (cm$^{-1}$) 3041, 2935, 2858, 1728, 1668, 1448, 1406, 1360, 1358, 1331, 1257, 1157, 1122, 1092, 1065, 1030, 951, 945, 889, 723 Elemental analysis for C$_9$H$_{16}$O$_1$ (%) Calcd. C, 77.1;H, 11.5. Found C, 77.3;H, 11.4.

Synthesis Example 3
Synthesis of poly(p-(cyclohexyloxypropyl)oxystyrene/p-hydroxystyrene)

In 48 g of tetrahydrofuran was dissolved 12 g of poly(p-hydroxystyrene) having a weight average molecular weight (Mw) of 9,000 and a dispersity (Mw/Mn) of 1.05. A catalytic amount of p-toluenesulfonic acid was added. At 10° C., 4.2 g (0.030 mol) of cyclohexyl propenyl ether was added to the solution, which was stirred for 2 hours. The reaction mixture was precipitated from a water/isopropanol mixture, followed by filtration and drying. The end polymer was obtained in an amount of 12.0 g. On $^1$H-NMR analysis, the ratio of p-(cyclohexyloxypropyl)oxystyrene units to p-hydroxystyrene units was approximately 23.0:77.0.

The polymer had a weight average molecular weight (Mw) of about 11,000 as analyzed by GPC and calculated on a polystyrene basis and a dispersity (Mw/Mn) of 1.10.

Synthesis Example 4
Synthesis of tri-branched poly(p-hydroxystyrene)

A 1-liter flask was charged with 500 ml of tetrahydrofuran as a solvent and 0.01 mol of sec-butyl lithium as an initiator. To the solution at −78° C. was added 40 g of p-tert-butoxystyrene. With stirring, polymerization reaction was effected for 30 minutes. The reaction solution turned red. For producing a branched polymer, 0.005 mol of p-chloromethylstyrene was added to the reaction solution whereupon reaction was effected for 5 minutes. The reaction solution was red. Further 20 g of p-tert-butoxystyrene was added. With stirring, polymerization reaction was effected for 30 minutes. Polymerization was stopped by adding 0.1 mol of methanol to the reaction solution.

For purifying the polymer, the reaction mixture was poured into methanol whereupon the polymer precipitated. Separation and drying yielded 44 g of a white polymer which was tri-branched poly(p-tert-butoxystyrene).

For producing tri-branched poly(p-hydroxystyrene), 44 g of the above tri-branched poly(p-tert-butoxystyrene) was dissolved in 400 ml of acetone. A minor amount of conc. hydrochloric acid was added to the solution at 60° C., which was stirred for 7 hours. The reaction solution was poured into water whereupon the polymer precipitated. Washing and drying yielded 25 g of a white polymer. Since a peak attributable to tert-butyl group was not found in GPC and proton-NMR analysis, this polymer was confirmed to be tri-branched poly(p-hydroxystyrene) having a narrow molecular weight distribution.

The polymer had a weight average molecular weight (Mw) of 8,500 as analyzed by GPC and calculated on a polystyrene basis and a dispersity (Mw/Mn) of 1.10.

Synthesis Example 5
Synthesis of tri-branched poly(p-(1-cyclohexyloxypropyl)-oxystyrene/p-hydroxystyrene)

On the tri-branched poly(p-hydroxystyrene) synthesized in Synthesis Example 4, 1-cyclohexyloxypropyl groups were partially substituted as in Synthesis Example 3.

Synthesis Example 6
Synthesis of nona-branched poly(p-hydroxystyrene)

A 2-liter flask was charged with 1000 ml of tetrahydrofuran as a solvent and 0.06 mol of sec-butyl lithium as an initiator. To the solution at −78° C. was added 60 g of p-tert-butoxystyrene. With stirring, polymerization reaction was effected for 30 minutes. The reaction solution turned red. For producing a tri-branched polymer, 0.03 mol of p-chloromethylstyrene was added to the reaction solution whereupon reaction was effected for 5 minutes. Then 30 g of p-tert-butoxystyrene was added to the reaction solution, which was stirred for 30 minutes for polymerization. The reaction solution was red. For producing penta-branched polymer, 0.015 mol of p-chloromethylstyrene was added to the reaction solution whereupon reaction was effected for 5 minutes. Then 15 g of p-tert-butoxystyrene was added to the reaction solution, which was stirred for 30 minutes for polymerization. The reaction solution was red. Finally for producing nona-branched polymer, 0.0075 mol of p-chloromethylstyrene was added to the reaction solution whereupon reaction was effected for 5 minutes. Then 7.5 g of p-tert-butoxystyrene was added to the reaction solution, which was stirred for 30 minutes for polymerization. The reaction solution was red. Polymerization was stopped by adding 0.1 mol of carbon dioxide gas to the reaction solution.

For purifying the polymer, the reaction mixture was poured into methanol whereupon the polymer precipitated. Separation and drying yielded 99 g of a white polymer which was nona-branched poly(p-tert-butoxystyrene).

For converting to nona-branched poly(p-hydroxystyrene), 99 g of the above nona-branched poly(p-tert-butoxystyrene) was dissolved in 1000 ml of acetone. A minor amount of conc. hydrochloric acid was added to the solution at 60° C., which was stirred for 7 hours. The reaction solution was poured into water whereupon the polymer precipitated. Washing and drying yielded 66 g of a white polymer. Since a peak attributable to tert-butyl group was not found on GPC and proton-NMR analysis, this polymer was confirmed to be nona-branched poly(p-hydroxystyrene) having a narrow molecular weight distribution.

The polymer had a weight average molecular weight (Mw) of 11,000 as analyzed by GPC and calculated on a polystyrene basis and a dispersity (Mw/Mn) of 1.25.

Synthesis Example 7
Synthesis of nona-branched poly(p-(1-cyclohexyloxypropyl)-oxystyrene/p-hydroxystyrene)

On the nona-branched poly(p-hydroxystyrene) synthesized in Synthesis Example 6, 1-cyclohexyloxypropyl groups were partially substituted as in Synthesis Example 3.

Examples & Comparative Examples

Resist compositions were prepared according to the formulation shown in Tables 1 to 3. The components listed in Tables 1 to 3 have the following meaning.

Polymer A: poly(p-hydroxystyrene) in which hydroxyl groups are protected with 23 mol % of cyclohexyloxypropyl groups, having a weight average molecular weight of 11,000.

Polymer B: poly(p-hydroxystyrene) in which hydroxyl groups are protected with 10 mol % of cyclohexyloxypropyl groups and 10 mol % of tert-butoxycarbonyl groups, having a weight average molecular weight of 11,000.

Polymer C: nano-branched poly(p-hydroxystyrene) in which hydroxyl groups are protected with 15 mol % of cyclohexyloxypropyl groups and 5 mol % of tert-butoxycarbonyl groups, having a weight average molecular weight of 14,000.

Polymer D: poly(p-hydroxystyrene) in which hydroxyl groups are protected with 20 mol % of cyclohexyloxypropyl groups and crosslinked with 1 mol % of 1,2-propane diol divinyl ether, having a weight average molecular weight of 13,000.

Polymer E: tri-branched poly(p-hydroxystyrene) in which hydroxyl groups are protected with 20 mol % of cyclohexyloxypropyl groups, having a weight average molecular weight of 11,000.

Polymer F: poly(p-hydroxystyrene) in which hydroxyl groups are protected with 22 mol % of cyclohexylmethyloxypropyl groups, having a weight average molecular weight of 12,000.

Polymer G: poly(p-hydroxystyrene) in which hydroxyl groups are protected with 20 mol % of cyclohexylmethyloxypropyl groups and crosslinked with 1 mol % of 1,4-butane diol divinyl ether, having a weight average molecular weight of 13,000.

Polymer H: p-hydroxystyrene/1-ethylcyclopentyl methacrylate copolymer having a compositional ratio (molar ratio) of 90:10, hydroxyl groups in the p-hydroxystyrene being protected with 15 mol % of cyclohexyloxypropyl groups, the copolymer having a weight average molecular weight of 12,000.

Polymer I: p-hydroxystyrene/tert-butyl acrylate copolymer having a compositional ratio (molar ratio) of 80:20, hydroxyl groups in the p-hydroxystyrene being protected with 10 mol % of cyclohexyloxypropyl groups, the copolymer having a weight average molecular weight of 12,000.

Polymer J: the same as Polymer I further containing 5% by weight of styrene and having a weight average molecular weight of 12,000.

Polymer K: p-hydroxystyrene/1-ethylcyclopentyl methacrylate copolymer having a compositional ratio (molar ratio) of 90:10, hydroxyl groups in the p-hydroxystyrene being protected with 10 mol % of cyclohexyloxypropyl groups and crosslinked with 2 mol % of 1,4-butane diol divinyl ether, the copolymer having a weight average molecular weight of 13,000.

Polymer L: poly(p-hydroxystyrene) in which hydroxyl groups are protected with 25 mol % of 1-ethoxypropyl groups and crosslinked with 3 mol % of 1,2-propane diol divinyl ether, having a weight average molecular weight of 13,000.

Polymer M: poly(p-hydroxystyrene) in which hydroxyl groups are protected with 15 mol % of 1-ethoxyethyl groups and 15 mol % of tert-butoxycarbonyl groups, having a weight average molecular weight of 12,000.

Polymer N: p-hydroxystyrene/1-ethylcyclopentyl methacrylate copolymer having a compositional ratio (molar ratio) of 70:30 and a weight average molecular weight of 11,000.

PAG1: triphenylsulfonium 4-toluenesulfonate
PAG2: (4-butoxyphenyl)diphenylsulfonium 10-camphorsulfonate
PAG3: bis(4-butylphenyl)iodonium 10-camphorsulfonate
PAG4: triphenylsulfonium 4-(4-toluenesulfonyloxy)benzene-sulfonate
PAG5: tris(4-butoxyphenyl)sulfonium nonafluorobutane-sulfonate
PAG6: N-(10-camphorsulfonyl)oxy-1,9-naphthalenedicarboxylic acid imide
PAG7: bis(cyclohexylsulfonyl)diazomethane
PAG8: bis(tert-butylsulfonyl)diazomethane
PAG9: bis(2,4-dimethylphenylsulfonyl)diazomethane
Basic compound A: triethanolamine
Basic compound B: tris(2-ethoxyethyl)amine
Organic acid derivative A: 4,4-bis(4'-hydroxyphenyl)valeric acid
Organic acid derivative B: salicylic acid
Surfactant A: FC-430 (Sumitomo 3M K.K.)
Surfactant B: Surflon S-381 (Asahi Glass K.K.)
UV absorber: 9,10-dimethylanthracene
Solvent A: propylene glycol methyl ether acetate
Solvent B: ethyl lactate Each resist solution was passed through a 0.2 µm Teflon filter and spin coated onto a silicon wafer which had been coated with an organic antireflection film (DUV-44 by Brewer Science) to a thickness of 800 Å. The coated silicon wafer was baked on a hot plate at 100° C. for 90 seconds. The thickness of the resist film was set at 0.6 µm.

The resist film was exposed through the patterned mask using an excimer laser stepper (NSR-S202A, from Nikon Corporation; NA=0.6 2/3 annular) baked at 110° C. for 90 seconds (PEB) and developed with a 2.38 wt % solution of tetramethylammonium hydroxide in water, thereby giving a positive pattern (Examples 1–24 and Comparative Examples 1–3).

The resist patterns obtained were evaluated as described below.

Resist Pattern Evaluation

The optimal exposure dose (sensitivity, Eop) was defined as the dose which provides a 1:1 resolution at the top and bottom of a 0.15 µm line-and-space pattern. The resolution of the resist under evaluation was defined as the minimum line width of the lines and spaces that separated at this dose. The shape in cross section of the resolved resist pattern was examined under a scanning electron microscope.

The depth of focus (DOF) was determined by offsetting the focal point and judging the resist to be passed when the resist pattern shape was kept rectangular and the resist pattern film thickness was kept above 80% of that at accurate focusing.

The PED stability of a resist was evaluated by effecting post-exposure bake (PEB) after 24 hours of holding from exposure at the optimum dose and determining a variation in line width.

The results of resist pattern evaluation are shown in Table 4.

Other Evaluation

The solubility of resist material in a solvent mixture was examined by visual observation and in terms of clogging upon filtration.

With respect to the applicability of a resist solution, uneven coating was visually observed. Additionally, using a film gage Clean Track Mark 8 (Tokyo Electron K.K.), the thickness of a resist film on a common wafer was measured at different positions, based on which a variation from the desired coating thickness (0.6 μm) was calculated. The applicability was rated "good" when the variation was within 0.5% (that is, within 0.003 μm), "unacceptable" when the variation was within 1%, and "poor" when the variation was more than 1%.

Storage stability was judged in terms of particle precipitation or sensitivity change during aging. After the resist solution was aged for 100 days at the longest, the number of particles of greater than 0.3 μm per ml of the resist solution was counted by means of a particle counter KL-20A (Rion K.K.), and the particle precipitation was determined "good" when the number of particles is not more than 5. Also, the sensitivity change was rated "good" when a change with time of sensitivity (Eop) was within 5% from that immediately after preparation, and "poor" when the change is more than 5%.

Defect appearing on the developed pattern was observed under a scanning electron microscope (TDSEM) model S-7280H (Hitachi K.K.). The resist film was rated "good" when the number of foreign particles was up to 10 per 100 μm², "unacceptable" when from 11 to 15, and "poor" when more than 15.

Defect left after resist stripping was examined using a surface scanner Surf-Scan 6220 (Tencol Instruments). A resist-coated 8-inch wafer was subjected to entire exposure rather than patterned exposure, processed in a conventional manner, and developed with a 2.38% TMAH solution before the resist film was peeled off (only the resist film in the exposed area was peeled). After the resist film was peeled, the wafer was examined and rated "good" when the number of foreign particles of greater than 0.20 μm was up to 100, "unacceptable" when from 101 to 150, and "poor" when more than 150.

The results are shown in Table 5.

TABLE 1

| Composition (pbw) | E1 | E2 | E3 | E4 | E5 | E6 | E7 | E8 | E9 | E10 | E11 | E12 |
|---|---|---|---|---|---|---|---|---|---|---|---|---|
| Polymer A | 80 | | | | | | | | | | | 40 |
| Polymer B | | 80 | | | | | | | | | | |
| Polymer C | | | 80 | | | | | | | | | |
| Polymer D | | | | 80 | | | | | | | | |
| Polymer E | | | | | 80 | | | | | | | |
| Polymer F | | | | | | 80 | | | | | | |
| Polymer G | | | | | | | 80 | | | | | |
| Polymer H | | | | | | | | 80 | | 40 | | |
| Polymer I | | | | | | | | | 80 | | | |
| Polymer J | | | | | | | | | | 40 | | |
| Polymer K | | | | | | | | | | | 80 | |
| Polymer L | | | | | | | | | | | | 40 |
| Polymer M | | | | | | | | | | | | |
| Polymer N | | | | | | | | | | | | |
| PAG1 | | 2 | | | | | | | | | | |
| PAG2 | 2 | | 2 | 2 | | | | | | 2 | | 2 |
| PAG3 | | | | | 2 | 1 | 2 | 2 | | | | |
| PAG4 | | | 2 | 2 | 2 | | | | | | | |
| PAG5 | | 1 | | | | 1 | | | | | | |
| PAG6 | 2 | | | | | | | 2 | | | | |
| PAG7 | | | | | | | | | | 2 | | 2 |
| PAG8 | | | | | | | | | | | 1 | |
| PAG9 | | | | | | | 1 | | | 1.5 | 1 | 1 |
| Dissolution inhibitor | | | | | | | | | | | | |
| Basic compound A | 0.3 | 0.3 | 0.15 | | | | | 0.3 | 0.3 | 0.3 | 0.3 | 0.3 |
| Basic compound B | | | 0.15 | 0.3 | 0.3 | 0.3 | | | | 0.3 | | |
| Organic acid derivative A | 1 | | | | | | 1 | 1 | 1 | 1 | 1 | 1 |
| Organic acid derivative B | | 1 | 1 | 1 | 1 | 1 | | | | | | |
| Surfactant A | | | | | | | 0.25 | 0.25 | 0.25 | 0.25 | 0.25 | |
| Surfactant B | 0.25 | 0.25 | 0.25 | 0.25 | 0.25 | | | | | | | 0.25 |
| UV absorber | | | | | | | | | | | | |
| Solvent A | 280 | 280 | 280 | 280 | 280 | 280 | 280 | 280 | 385 | 280 | 385 | 280 |
| Solvent B | 105 | 105 | 105 | 105 | 105 | 105 | 105 | 105 | | 105 | | 105 |

TABLE 2

| Composition (pbw) | E13 | E14 | E15 | E16 | E17 | E18 | E19 | E20 | E21 | E22 | E23 | E24 |
|---|---|---|---|---|---|---|---|---|---|---|---|---|
| Polymer A | 40 | | 40 | | 60 | | | | | | | |
| Polymer B | 20 | | | | | | | | | | 75 | |
| Polymer C | 20 | | | | | 40 | | | | | | 80 |
| Polymer D | | 40 | 40 | 60 | | 40 | | | | | | |
| Polymer E | | | | | | | 40 | | | | | |
| Polymer F | | | | | | | | | | | | |
| Polymer G | | 40 | | | | | 40 | | | | | |

TABLE 2-continued

| Composition (pbw) | E13 | E14 | E15 | E16 | E17 | E18 | E19 | E20 | E21 | E22 | E23 | E24 |
|---|---|---|---|---|---|---|---|---|---|---|---|---|
| Polymer H | | | | | | | | 60 | 40 | | | |
| Polymer I | | | | | | | | 20 | | | | |
| Polymer J | | | | | | | | | | | | |
| Polymer K | | | | | | | | | | 40 | 60 | |
| Polymer L | | | | | 20 | | | | | | | |
| Polymer M | | | | 20 | | | | | | | | |
| Polymer N | | | | | | | | | | | | |
| PAG1 | | 20 | | | | | | 2 | | | | |
| PAG2 | | | | | | 2 | 2 | | | 2 | | |
| PAG3 | 2 | 2 | 2 | 1 | | | | | | | 2 | 1 |
| PAG4 | | | 2 | | | | | | | 2 | 2 | |
| PAG5 | | | | 1 | | | | | 1 | | | 1 |
| PAG6 | | 2 | | | | | 2 | | | | | |
| PAG7 | | | | | 2.5 | | | | | 1.5 | | |
| PAG8 | | | | | | | | | | 0.5 | | |
| PAG9 | 1 | | | | 1.5 | 1 | | | | 1 | | |
| Dissolution inhibitor | | 5 | | | | | | | | | | |
| Basic compound A | | | | | 0.15 | | | 0.3 | 0.3 | 0.3 | | |
| Basic compound B | 0.3 | 0.3 | 0.3 | 0.3 | 0.15 | 0.3 | 0.3 | | | | 0.3 | 0.3 |
| Organic acid derivative A | | 1 | 1 | 1 | 1 | 1 | 1 | | | | 1 | |
| Organic acid derivative B | 1 | 1 | | | | | 1 | 1 | 1 | 1 | | 1 |
| Surfactant A | | 0.25 | 0.25 | 0.25 | 0.25 | | | 0.25 | | 0.25 | 0.25 | |
| Surfactant B | 0.25 | | | | | 0.25 | 0.25 | | 0.25 | | | 0.25 |
| UV absorber | | | | 0.5 | | | | | | | | |
| Solvent A | 280 | 280 | 280 | 280 | 385 | 280 | 280 | 280 | 385 | 280 | 280 | 280 |
| Solvent B | 105 | 105 | 105 | 105 | | 105 | 105 | 105 | | 105 | 105 | 105 |

TABLE 3

| Composition (pbw) | CE1 | CE2 | CE3 |
|---|---|---|---|
| Polymer L | 80 | | |
| Polymer M | | 80 | |
| Polymer N | | | 80 |
| PAG1 | | | |
| PAG2 | | | |
| PAG3 | | | |
| PAG4 | | | |
| PAG5 | | | |
| PAG6 | | | |
| PAG7 | | | |
| PAG8 | 2 | 2 | |
| PAG9 | | | 2 |
| Dissolution inhibitor | | | |
| Basic compound A | 0.3 | | |
| Basic compound B | | 0.3 | 0.3 |
| Organic acid derivative A | 1 | 1 | 1 |
| Organic acid derivative B | | | |
| Surfactant A | 0.25 | 0.25 | |
| Surfactant B | | | 0.25 |
| UV absorber | | | |
| Solvent A | 280 | 385 | 280 |
| Solvent B | 105 | | 105 |

TABLE 4

| | Sensitivity (mJ/cm$^2$) | Resolution ($\mu$m) | Profile shape | DOF for 0.15 $\mu$m ($\mu$m) | Profile shape* | 24 hr PED dimensional stability (nm) |
|---|---|---|---|---|---|---|
| E1 | 27 | 0.14 | rectangular | 1.1 | rectangular | −10 |
| E2 | 31 | 0.14 | rectangular | 1.1 | rectangular | −8 |
| E3 | 28 | 0.14 | rectangular | 1.0 | rectangular | −10 |
| E4 | 25 | 0.14 | rectangular | 1.1 | rectangular | −10 |
| E5 | 26 | 0.14 | rectangular | 1.0 | rectangular | −10 |
| E6 | 31 | 0.15 | rectangular | 1.1 | rectangular | −8 |
| E7 | 29 | 0.14 | rectangular | 1.1 | rectangular | −10 |
| E8 | 28 | 0.14 | rectangular | 1.1 | rectangular | −12 |
| E9 | 32 | 0.14 | rectangular | 1.1 | rectangular | −10 |
| E10 | 31 | 0.14 | rectangular | 1.1 | rectangular | −10 |
| E11 | 29 | 0.14 | rectangular | 1.0 | rectangular | −8 |
| E12 | 28 | 0.14 | rectangular | 1.1 | rectangular | −10 |
| E13 | 27 | 0.14 | rectangular | 1.1 | rectangular | −8 |
| E14 | 27 | 0.14 | rectangular | 1.1 | rectangular | −10 |
| E15 | 26 | 0.14 | rectangular | 1.1 | rectangular | −10 |
| E16 | 28 | 0.15 | rectangular | 1.1 | rectangular | −8 |

TABLE 4-continued

| | Sensitivity (mJ/cm$^2$) | Resolution (μm) | Profile shape | DOF for 0.15 μm (μm) | Profile shape* | 24 hr PED dimensional stability (nm) |
|---|---|---|---|---|---|---|
| E17 | 29 | 0.14 | rectangular | 1.0 | rectangular | −10 |
| E18 | 28 | 0.14 | rectangular | 1.1 | rectangular | −8 |
| E19 | 27 | 0.14 | rectangular | 1.1 | rectangular | −10 |
| E20 | 29 | 0.14 | rectangular | 1.1 | rectangular | −10 |
| E21 | 27 | 0.14 | rectangular | 1.0 | rectangular | −10 |
| E22 | 29 | 0.14 | rectangular | 1.1 | rectangular | −10 |
| E23 | 28 | 0.14 | rectangular | 1.1 | rectangular | −8 |
| E24 | 27 | 0.14 | rectangular | 1.1 | rectangular | −8 |
| CE1 | 23 | 0.15 | somewhat rounded head | 0.6 | rounded head | −10 |
| CE2 | 27 | 0.15 | rounded head | 0.6 | rounded head | −8 |
| CE3 | 27 | 0.15 | forward tapered | 0.6 | forward tapered | −10 |

*The pattern shape when the focal point was offset −0.4 μm on the minus side upon measurement of DOF for the 0.15 μm line-and-space pattern.

TABLE 5

| | Dissolution | Application | 100 day storage stability | Defect after development |
|---|---|---|---|---|
| E1 | good | good | good | good |
| E2 | good | good | good | good |
| E3 | good | good | good | good |
| E4 | good | good | good | good |
| E5 | good | good | good | good |
| E6 | good | good | good | good |
| E7 | good | good | good | good |
| E8 | good | good | good | good |
| E9 | good | good | good | good |
| E10 | good | good | good | good |
| E11 | good | good | good | good |
| E12 | good | good | good | good |
| E13 | good | good | good | good |
| E14 | good | good | good | good |
| E15 | good | good | good | good |
| E16 | good | good | good | good |
| E17 | good | good | good | good |
| E18 | good | good | good | good |
| E19 | good | good | good | good |
| E20 | good | good | good | good |
| E21 | good | good | good | good |
| E22 | good | good | good | good |
| E23 | good | good | good | good |
| E24 | good | good | good | good |
| CE1 | good | good | <30 days (sensitivity changed) | good |
| CE2 | good | unacceptable | <30 days (sensitivity changed) | unacceptable |
| CE3 | good | good | good | poor |

There have been described chemical amplification type positive resist compositions comprising a resin having substituents of formula (1). The compositions have many advantages including improved resolution, minimized line width variation or shape degradation even on long-term PED, minimized defect left after coating, development and stripping, and improved pattern profile after development. The compositions are improved in focal latitude in that the pattern profile maintains rectangularity and undergoes minimized slimming when the focal point is offset. The compositions are thus suited for microfabrication by any lithography, especially deep UV lithography.

Japanese Patent Application No. 2000-061357 is incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

What is claimed is:

1. A chemical amplification, positive resist composition comprising:

(A) a photoacid generator and (B) a resin which changes its solubility in an alkali developer under the action of acid and has substituents of the following general formula (1):

$$C_6H_{11}\text{—}(CH_2)_n OCH(CH_2CH_3)\text{—} \quad (1)$$

wherein $C_6H_{11}$ is cyclohexyl and n is 0 or 1, and wherein the resin has a weight average molecular weight of about 3,000 to about 100,000 and has a polydispersity of up to 1.5, to form said chemical amplification, positive resist composition, and wherein the resin (B) further has acid labile groups which are selected from the group consisting of formulae (6) and (7):

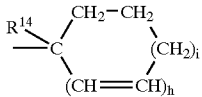

(6)

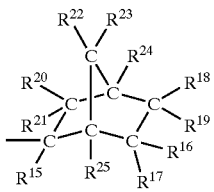

(7)

$R^{14}$ is a straight, branched or cyclic alkyl group of 1 to 8 carbon atoms or a substituted or unsubstituted aryl group of 6 to 20 carbon atoms, h is equal to 0 or 1, and i is equal to 0, 1, 2 or 3, satisfying 2h+i=2 or 3, $R^{15}$ is a straight, branched or cyclic alkyl group of 1 to 8 carbon atoms or a substituted or unsubstituted aryl group of 6 to 20 carbon atoms, $R^{16}$ to $R^{25}$ are independently hydrogen or monovalent hydrocarbon groups of 1 to 15 carbon atoms which optionally contain a hetero atom, a pair of $R^{16}$ to $R^{25}$, taken together, optionally form a ring, and each of $R^{16}$ to $R^{25}$ is a divalent hydrocarbon group of 1 to 15 carbon atoms which optionally contain a hetero atom when they form a ring, or two of $R^{16}$ to $R^{25}$ which are attached to adjoining carbon atoms optionally bond together directly to form a double bond.

2. The resist composition of claim 1 wherein the resin (B) is an alkali-soluble resin comprising units of the following formula (2) or (2') wherein some or all of the hydrogen atoms on phenolic hydroxyl groups and/or carboxyl groups are protected with substituents of the formula (1),

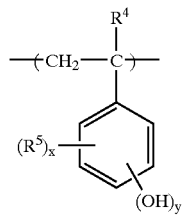

(2)

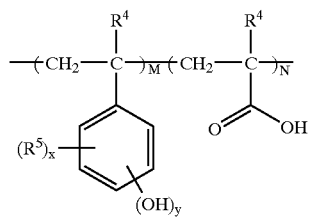

(2')

wherein $R^4$ is hydrogen or methyl, $R^5$ is a straight, branched or cyclic alkyl group of 1 to 8 carbon atoms, x is 0 or a positive integer, y is a positive integer, satisfying x+y≦5, M and N are positive integers satisfying 0<N/(M+N)≦0.5.

3. A resist composition according to claim 1, wherein said hetero atom is oxygen.

4. A resist composition according to claim 1, wherein the resin has phenolic hydroxyl groups and/or carboxyl groups in which some or all of the hydrogen atoms on the phenolic hydroxyl groups and/or on the carboxyl groups are substituted with one or more substituents of formula (1).

5. A resist composition according to claim 4, wherein the proportion of substituents in the resin is about 1 to 40 mol % based on the phenolic hydroxyl groups and/or carboxyl groups.

6. A resist composition according to claim 4, wherein the total amount of substituents of formula (1) and acid labile groups is 1 to 80 mol % based on the phenolic hydroxyl groups and or carboxyl groups.

7. A resist composition according to claim 4, wherein 0 to 50 mol % of the hydrogen atoms on phenolic hydroxyl groups are crosslinked within the molecule and/or between molecules.

8. A resist composition according to claim 7, wherein the crosslinking groups have C—O—C linkages.

9. A resist composition according to claim 8, wherein the crosslinking groups having C—O—C linkages are of formulae (3a) and/or (3b),

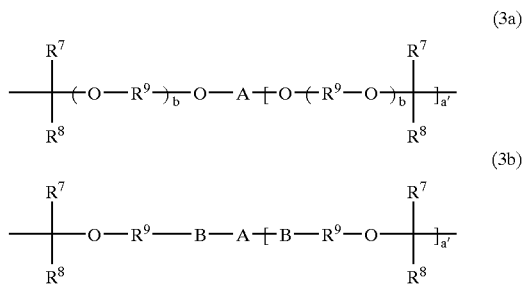

wherein each of $R^7$ and $R^8$ is hydrogen or a straight, branched or cyclic alkyl group of 1 to 8 carbon atoms, or $R^7$ and $R^8$, taken together, optionally form a ring, and each of $R^7$ and $R^8$ is a straight or branched alkylene group of 1 to 8 carbon atoms when they form a ring, $R^9$ is a straight, branched or cyclic alkylene group of 1 to 10 carbon atoms, letter b is 0 or an integer of 1 to 10, A is an a-valent aliphatic or alicyclic saturated hydrocarbon group, aromatic hydrocarbon group or heterocyclic group of 1 to 50 carbon atoms, which is optionally separated by a hetero atom and in which some of the hydrogen atoms attached to carbon atoms may be replaced by hydroxyl, carboxyl, carbonyl or halogen, B is —CO—O—, —NHCO—O— or —NHCONH—, letter a is an integer of 2 to 8 and a' is an integer of 1 to 7.

10. A resist composition according to claim 9, wherein in formula (3a), $R^7$ is methyl, $R^8$ is hydrogen, b is equal to 0, and A is ethylene, 1,4,-butylene, or 1,4-cyclohexylene.

11. A resist composition according to claim 1, wherein the ratio of substituents of formula (1) is 10% or more of the total of substituents of formula (1) and acid labile groups.

12. A resist composition according to claim 1, wherein the photoacid generator is a sulfonium salt, an iodonium salt, a sulfanyldiazomethane, or an N-sulfonyloxyimide, or a mixture thereof and wherein the resist composition optionally further contains one or more of an organic solvent, a resin which changes its solubility in an alkali developer under the action of an acid and is free of substituents of formula (1), a basic compound, and organic acid derivative, or a compound with a molecular weight of up to 3,000 which changes its solubility in an alkali developer under the action of an acid.

13. A resist pattern comprising a resist composition according to claim 1.

14. In a method of microfabricating an integrated circuit by lithography, wherein the improvement is the use of a resist composition according to claim 1.

15. A chemical amplification, positive resist composition comprising:

(A) a photoacid generator and (B) a branched, alkali-soluble resin comprising units of the following formula (2") wherein some of the hydrogen atoms on phenolic hydroxyl groups are protected with substituents of the formula (1):

$C_6H_{11}$—$(CH_2)_n$OCH($CH_2CH_3$)— (1)

wherein $C_6H_{11}$ is cyclohexyl and n is 0 or 1,

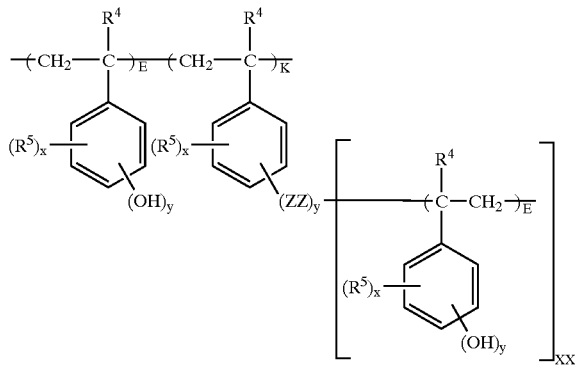

wherein $R^4$ is hydrogen or methyl, $R^5$ is a straight, branched or cyclic alkyl group of 1 to 8 carbon atoms, x is 0 or a positive integer, y is a positive integer, satisfying $x+y \leq 5$, ZZ is a divalent organic group selected from the group consisting of $CH_2$, CH(OH), $CR^5$(OH), C=O, and $C(OR^5)$(OH), or a trivalent organic group represented by —C(OH)=, E is the same or different and is a positive integer, K is a positive integer, satisfying $0.001 \leq K/(K+E) \leq 0.1$, and XX is 1 or 2.

16. The resist composition of claim 15, wherein the resin (B) further has acid labile groups which are selected from the group consisting of groups of formulae (4) to (7), tertiary alkyl groups of 4 to 20 carbon atoms, trialkylsilyl groups in which each alkyl moiety has 1 to 6 carbon atoms, and oxoalkyl groups of 4 to 20 carbon atoms,

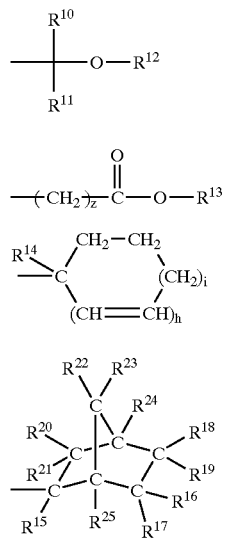

wherein $R^{10}$ and $R^{11}$ each are hydrogen or a straight, branched or cyclic alkyl group of 1 to 18 carbon atoms, $R^{12}$ is a monovalent hydrocarbon group of 1 to 18 carbon atoms which optionally contains a hetero atom, a pair of $R^{10}$ and $R^{11}$, $R^{10}$ and $R^{12}$, or $R^{11}$ and $R^{12}$ optionally form a ring, wherein each of $R^{10}$, $R^{11}$ and $R^{12}$ is a straight or branched alkylene group of 1 to 18 carbon atoms when they form a ring, $R^{13}$ is a tertiary alkyl group of 4 to 20 carbon atoms, a trialkylsilyl group in which each alkyl moiety has 1 to 6 carbon atoms, an oxoalkyl group of 4 to 20 carbon atoms, or a group of formula (4), z is an integer of 0 to 6, $R^{14}$ is a straight, branched or cyclic alkyl group of 1 to 8 carbon atoms or a substituted or unsubstituted aryl group of 6 to 20 carbon atoms, h is equal to 0 or 1, and i is equal to 0, 1, 2 or 3, satisfying 2h+i=2 or 3, $R^{15}$ is a straight, branched or cyclic alkyl group of 1 to 8 carbon atoms or a substituted or unsubstituted aryl group of 6 to 20 carbon atoms, $R^{16}$ to $R^{25}$ are independently hydrogen or monovalent hydrocarbon groups of 1 to 15 carbon atoms which optionally contain a hetero atom, a pair of $R^{16}$ to $R^{25}$, taken together, optionally form a ring, and each of $R^{16}$ to $R^{25}$ is a divalent hydrocarbon group of 1 to 15 carbon atoms which optionally contain a hetero atom when they form a ring, or two of $R^{16}$ to $R^{25}$ which are attached to adjoining carbon atoms optionally bond together directly to form a double bond.

17. A chemical amplification, positive resist composition comprising:
(A) a photoacid generator and
(B) a resin which changes its solubility in an alkali developer under the action of acid and has substituents of the following general formula (1):

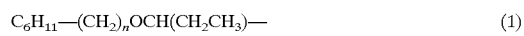

wherein $C_6H_{11}$ is cyclohexyl and n is 1.

18. The resist composition of claim 17 wherein the resin (B) is an alkali-soluble resin comprising units of the following formula (2) or (2') wherein some or all of the hydrogen atoms on phenolic hydroxyl groups and/or carboxyl groups are protected with substituents of the formula (1):

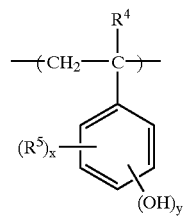

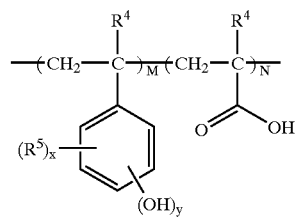

wherein $R^4$ is hydrogen or methyl, $R^5$ is a straight, branched or cyclic alkyl group of 1 to 8 carbon atoms, x is 0 or a positive integer, y is a positive integer, satisfying $x+y \leq 5$, M and N are positive integers satisfying $0 \leq N/(M+N) \leq 0.5$.

19. The resist composition of claim 17, wherein the resin (B) further has acid labile groups which are selected from the group consisting of groups of formulae (4) to (7), tertiary alkyl groups of 4 to 20 carbon atoms, trialkylsilyl groups in which each alkyl moiety has 1 to 6 carbon atoms, and oxoalkyl groups of 4 to 20 carbon atoms,

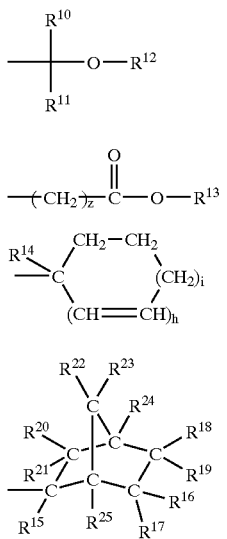

wherein $R^{10}$ and $R^{11}$ each are hydrogen or a straight, branched or cyclic alkyl group of 1 to 18 carbon atoms, $R^{12}$ is a monovalent hydrocarbon group of 1 to 18 carbon atoms which optionally contains a hetero atom, a pair of $R^{10}$ and $R^{11}$, $R^{10}$ and $R^{12}$, or $R^{11}$ and $R^{12}$ optionally form a ring, wherein each of $R^{10}$, $R^{11}$ and $R^{12}$ is a straight or branched alkylene group of 1 to 18 carbon atoms when they form a ring, $R^{13}$ is a tertiary alkyl group of 4 to 20 carbon atoms, a trialkylsilyl group in which each alkyl moiety has 1 to 6 carbon atoms, an oxoalkyl group of 4 to 20 carbon atoms, or a group of formula (4), z is an integer of 0 to 6, $R^{14}$ is a straight, branched or cyclic alkyl group of 1 to 8 carbon atoms or a substituted or unsubstituted aryl group of 6 to 20 carbon atoms, h is equal to 0 or 1, and i is equal to 0, 1, 2 or 3, satisfying 2h+i=2 or 3, $R^{15}$ is a straight, branched or cyclic alkyl group of 1 to 8 carbon atoms or a substituted or unsubstituted aryl group of 6 to 20 carbon atoms, $R^{16}$ to $R^{25}$ are independently hydrogen or monovalent hydrocarbon groups of 1 to 15 carbon atoms which optionally contain a hetero atom, a pair of $R^{16}$ to $R^{25}$, taken together, optionally form a ring, and each of $R^{16}$ to $R^{25}$ is a divalent hydrocarbon group of 1 to 15 carbon atoms which optionally contain a hetero atom when they form a ring, or two of $R^{16}$ to $R^{25}$ which are attached to adjoining carbon atoms optionally bond together directly to form a double bond.

* * * * *